United States Patent
Chen et al.

(10) Patent No.: US 9,640,273 B1
(45) Date of Patent: May 2, 2017

(54) MITIGATING HOT ELECTRON PROGRAM DISTURB

(71) Applicant: SanDisk Technologies LLC, Plano, TX (US)

(72) Inventors: Hong-Yan Chen, Sunnyvale, CA (US); Yingda Dong, San Jose, CA (US); Wei Zhao, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/247,746

(22) Filed: Aug. 25, 2016

(51) Int. Cl.
| | |
|---|---|
| *G11C 16/10* | (2006.01) |
| *G11C 16/34* | (2006.01) |
| *G11C 16/04* | (2006.01) |
| *G11C 16/24* | (2006.01) |
| *G11C 16/26* | (2006.01) |
| *G11C 16/14* | (2006.01) |
| *G11C 16/08* | (2006.01) |

(52) U.S. Cl.
CPC ...... *G11C 16/3431* (2013.01); *G11C 16/0466* (2013.01); *G11C 16/0483* (2013.01); *G11C 16/08* (2013.01); *G11C 16/10* (2013.01); *G11C 16/14* (2013.01); *G11C 16/24* (2013.01); *G11C 16/26* (2013.01); *G11C 16/3418* (2013.01); *G11C 16/3427* (2013.01)

(58) Field of Classification Search
CPC .......................... G11C 16/3418; G11C 16/3427
USPC ........................................ 365/185.02, 185.28
See application file for complete search history.

(56) References Cited

U.S. PATENT DOCUMENTS

| | | | | |
|---|---|---|---|---|
| 7,450,430 | B2 * | 11/2008 | Hemink | G11C 16/3427 365/185.17 |
| 8,526,233 | B2 | 9/2013 | Hemink et al. | |
| 8,537,617 | B2 | 9/2013 | Kim et al. | |
| 8,644,075 | B2 | 2/2014 | Hemink et al. | |
| 8,988,939 | B2 | 3/2015 | Dunga et al. | |
| 8,988,945 | B1 * | 3/2015 | Miwa | G11C 16/3427 365/185.02 |
| 2008/0159002 | A1 | 7/2008 | Dong et al. | |
| 2009/0086542 | A1 | 4/2009 | Lee et al. | |
| 2016/0148691 | A1 | 5/2016 | Rabkin et al. | |

* cited by examiner

*Primary Examiner* — Son Mai
(74) *Attorney, Agent, or Firm* — Vierra Magen Marcus LLP

(57) ABSTRACT

Techniques are provided for preventing program disturb when programming a memory device. Hot electron injection program disturb is prevented or reduced. Voltage boosting of the NAND channel of a program inhibited NAND string may be controlled in a manner to reduce or eliminate a lateral electric field that could possibly accelerate electrons in the NAND channel. If the electrons gain enough energy due to the lateral electric field, they could potentially be injected into the charge storage region of a memory cell, thereby causing program disturb. Thus, the voltage boosting can prevent or reduce injection of hot electrons from the NAND channel to a charge storage region of a NAND memory cell during a programming operation, thereby preventing or reducing program disturb.

20 Claims, 17 Drawing Sheets

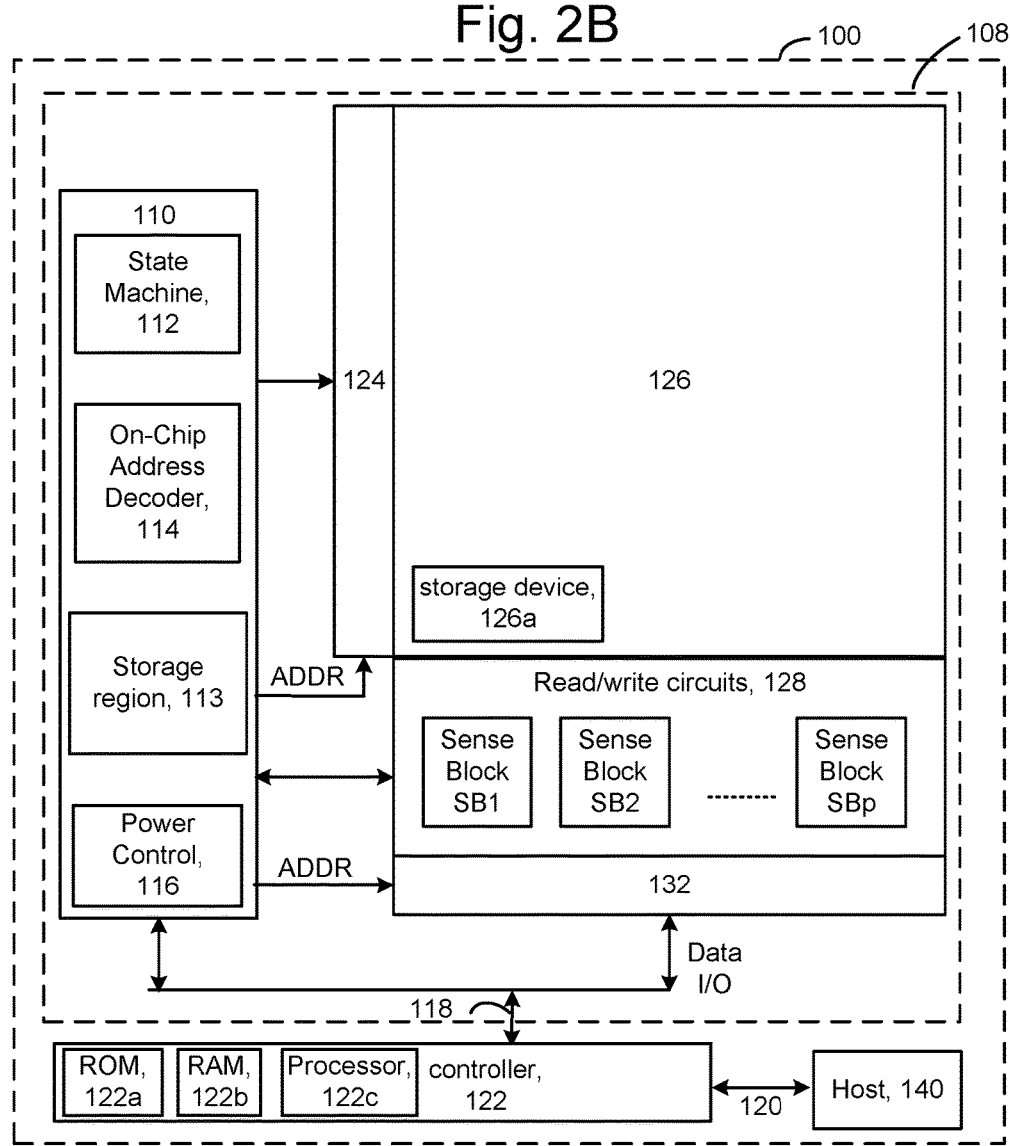

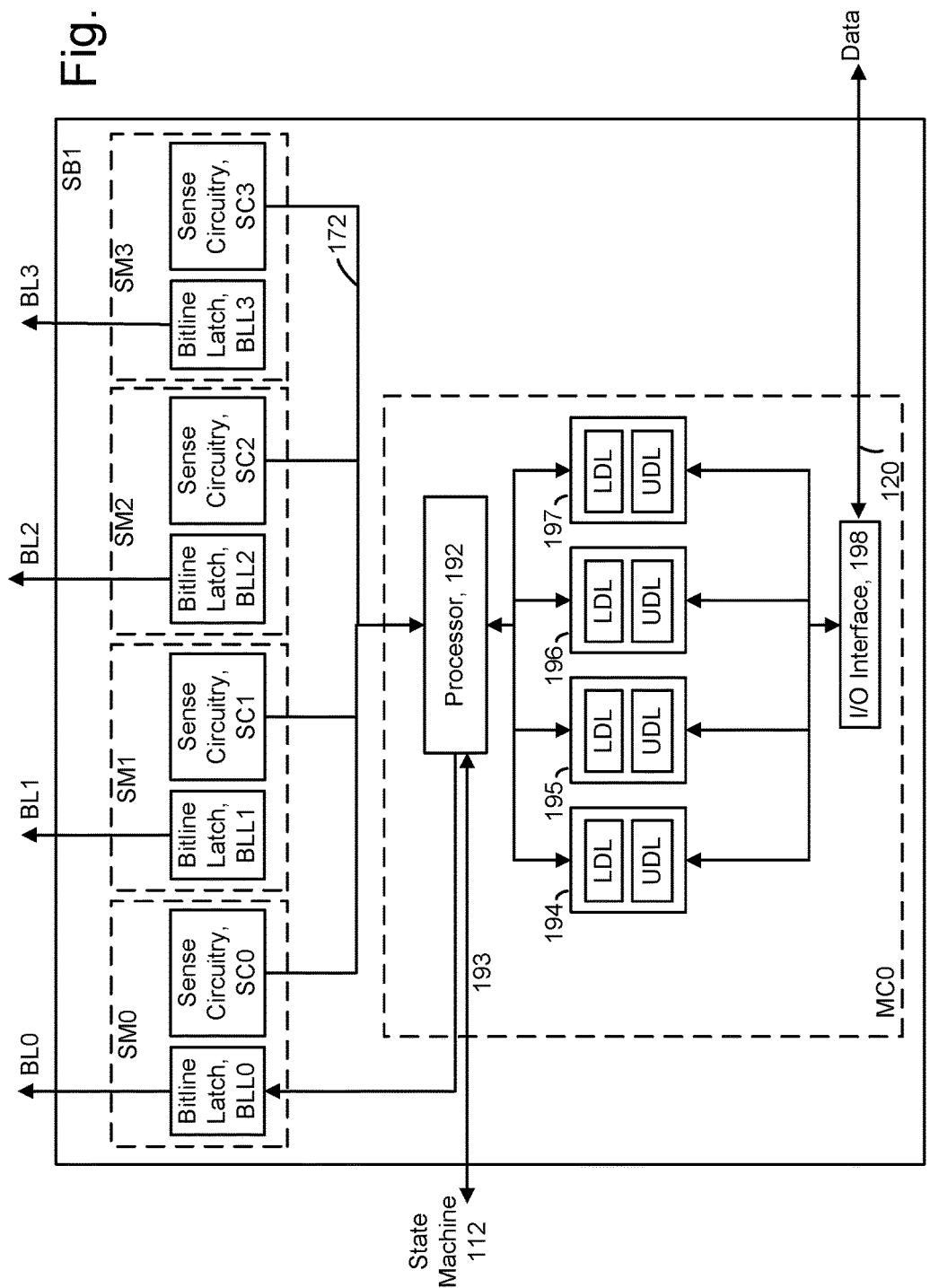

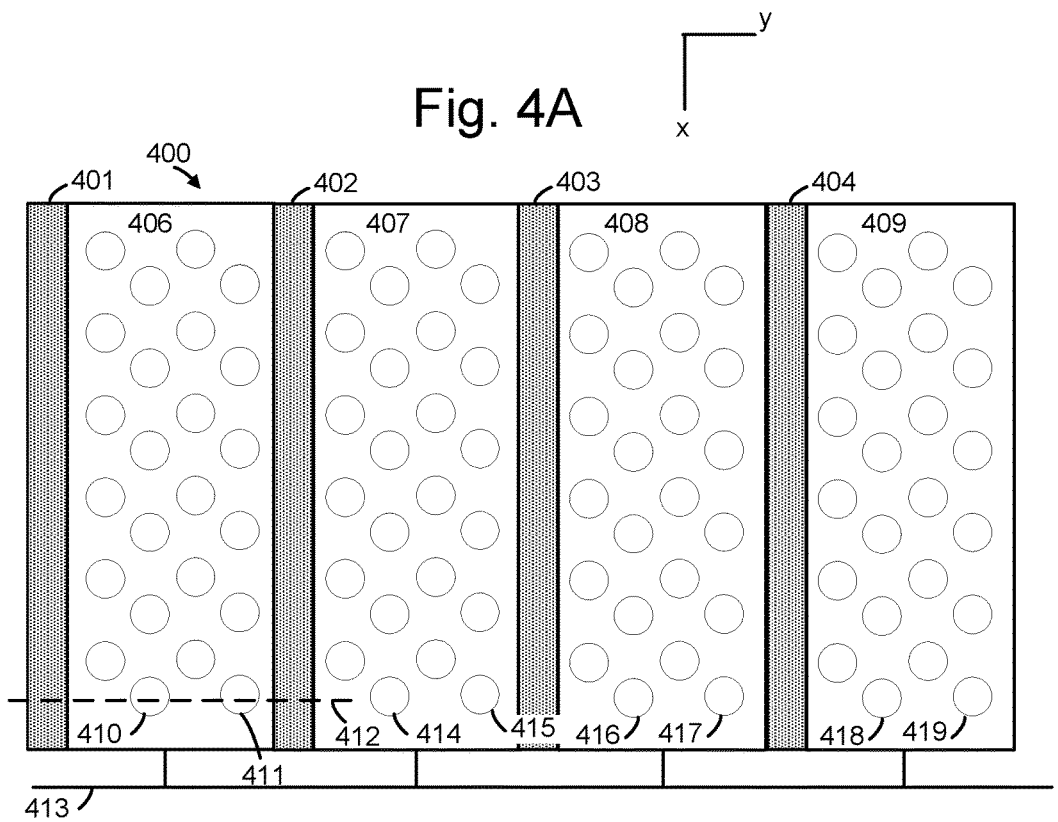
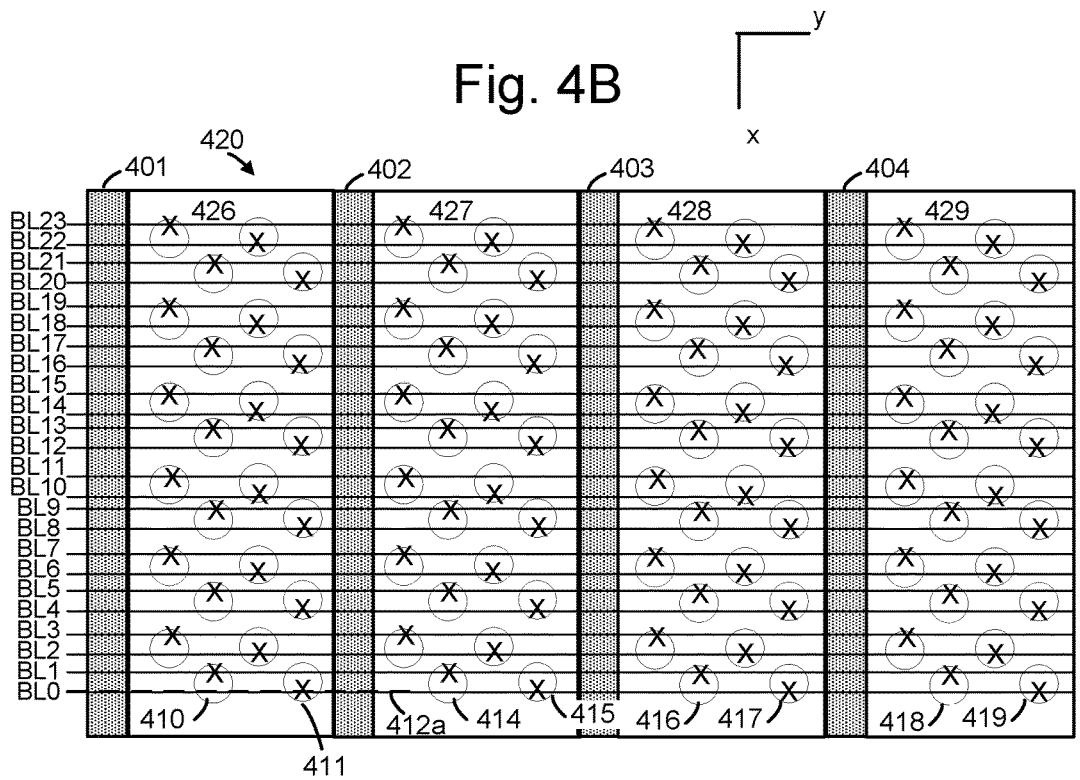

Fig. 4D
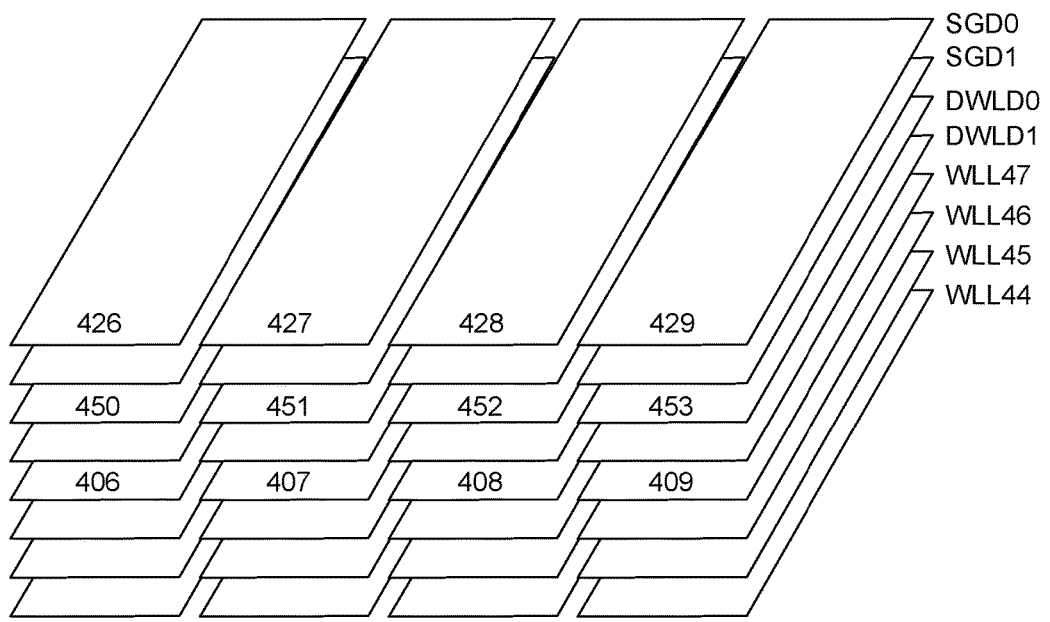
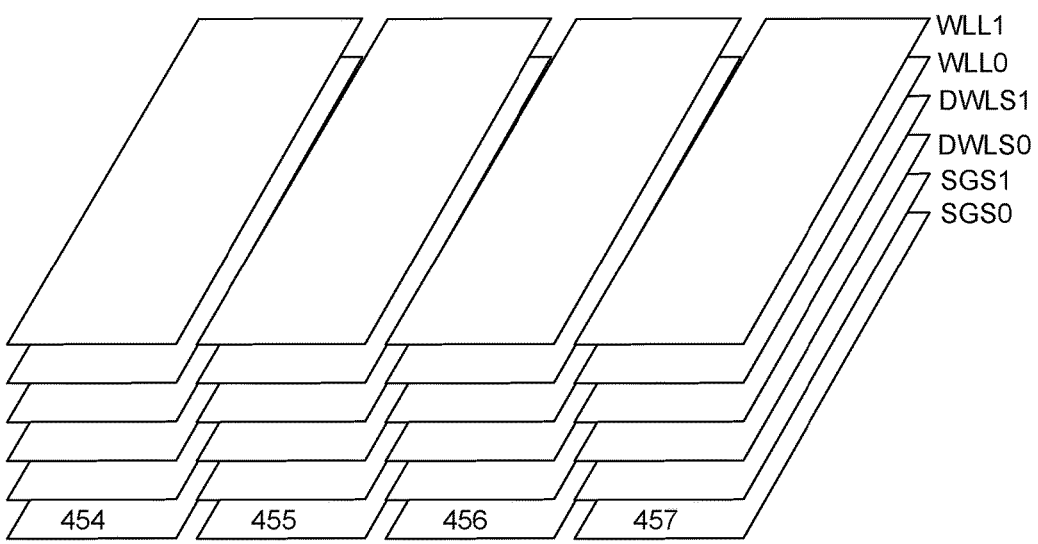

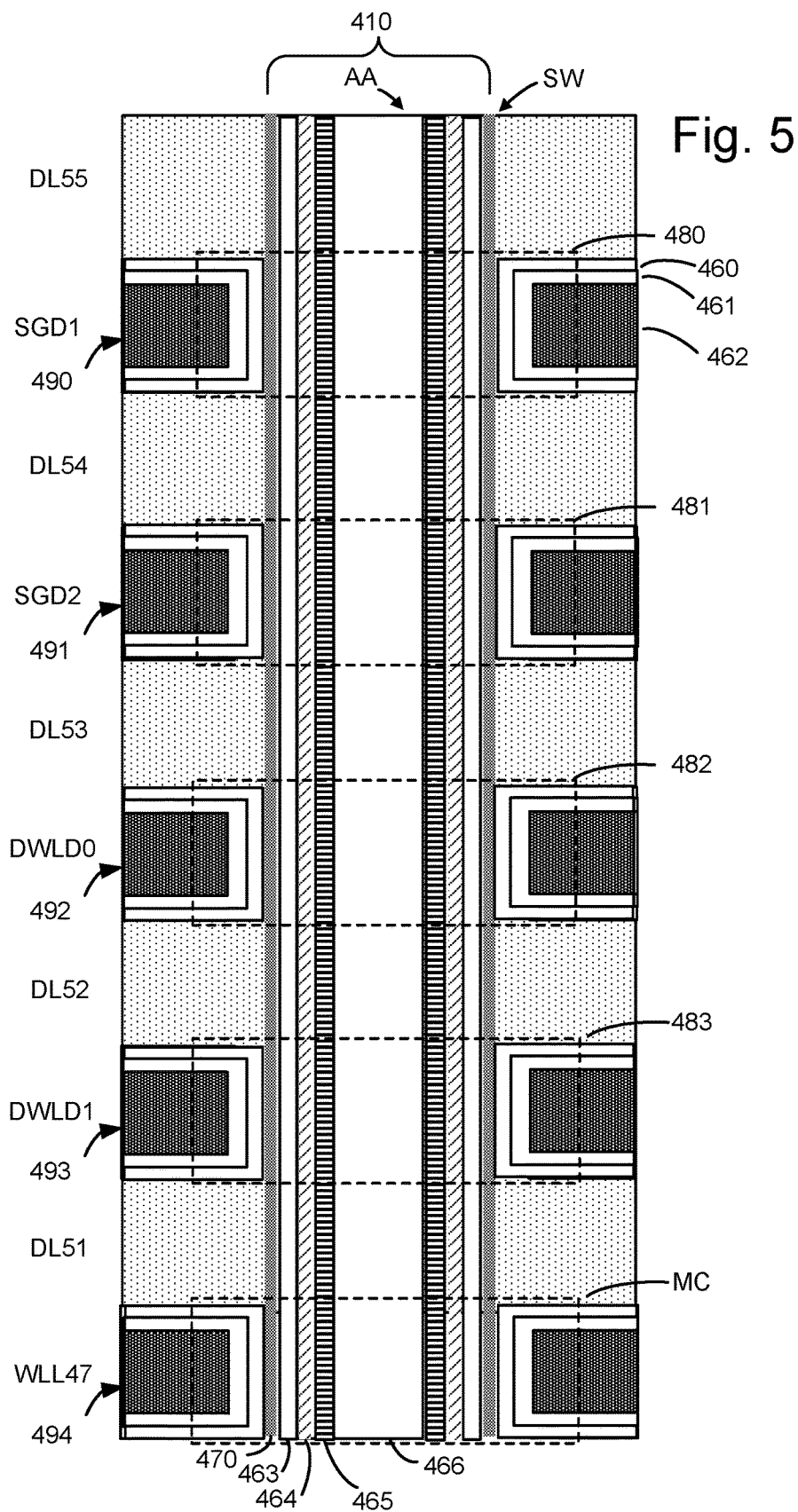

MITIGATING HOT ELECTRON PROGRAM DISTURB

BACKGROUND

The present technology relates to a memory device and to techniques for operating a memory device.

Recently, ultra high density storage devices have been proposed using a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells and of select gate transistors are provided by the conductive layers.

Each memory cell has a charge storage region such as a dielectric charge trapping region or a conductive floating gate. A memory cell may be programmed by applying a programming voltage to its control gate to add or remove charge from its charge storage region, thereby altering the threshold voltage of the memory cell.

However, various challenges exist in programming such memory devices.

BRIEF DESCRIPTION OF THE DRAWINGS

Like-numbered elements refer to common components in the different figures.

FIG. 2B is a functional block diagram of a memory device such as the 3D stacked non-volatile memory device 100 of FIG. 2A.

FIG. 3 is a block diagram depicting one embodiment of the sense block SB1 of FIG. 2B.

FIG. 4A depicts a top view of an example word line layer 400 of the block BLK0 of FIG. 2A, in a straight NAND string embodiment.

FIG. 4B depicts a top view of an example SGD layer 420, consistent with FIG. 4A.

FIG. 4D depicts an alternative view of the select gate layers and word line layers of the stack 440 of FIG. 4C.

FIG. 5 depicts a view of the region 442 of FIG. 4C.

DETAILED DESCRIPTION

Techniques are provided for performing a programming operation in a memory device. Embodiments of programming techniques disclosed herein prevent or reduce program disturb. Embodiments of programming techniques disclosed herein prevent or reduce injection of hot electrons from a NAND channel to a charge storage region of a NAND memory cell during a programming operation. In some embodiments, the NAND channel is in a three dimensional (3D) memory array.

In one embodiment, voltage boosting of the NAND channel of a program inhibited NAND string is controlled in a manner to reduce or eliminate a lateral electric field that could possibly accelerate electrons in the NAND channel. If the electrons gain enough energy due to the lateral electric field, they could potentially be injected into the charge storage region of a memory cell, thereby causing program disturb. Thus, the voltage boosting can prevent or reduce injection of hot electrons from the NAND channel to a charge storage region of a NAND memory cell during a programming operation, thereby preventing or reducing program disturb.

In one embodiment, boosting the NAND channel includes applying different boosting conditions to a first set of one or more word lines between the selected word line and a source end of the program inhibited NAND string, and a second set of word lines that includes the selected word line and one or more word lines between the selected word line and a drain end of the program inhibited NAND string. In one embodiment, the first set of one or more word lines is boosted prior to the second set of word lines. This may reduce or eliminate a lateral electric field in the NAND channel near the memory cell connected to the selected word line. In one embodiment, a boosting voltage applied to the first set of one or more word lines is ramped at a faster rate than a boosting voltage applied to the second set of word lines. This may reduce or eliminate a lateral electric field in the NAND channel near the memory cell connected to the selected word line. Thus, different boosting conditions applied to the first and second set of word lines can prevent or reduce injection of hot electrons from the NAND channel to a charge storage region of a NAND memory cell during a programming operation.

In one embodiment, the channel boosting is performed after a channel pre-charge phase. The channel pre-charge may result in one or more voltages in a program inhibited NAND channel. It is possible for there to be a potential gradient near the memory cell connected to the word line that has been selected for programming. This potential gradient may result in an electric field that could accelerate electrons in the NAND channel. However, the channel boosting is performed in a manner to reduce or eliminate the potential gradient, in one embodiment. Stated another way, the channel boosting is performed in a manner to reduce or eliminate the electric field, in one embodiment.

Figure 1A:
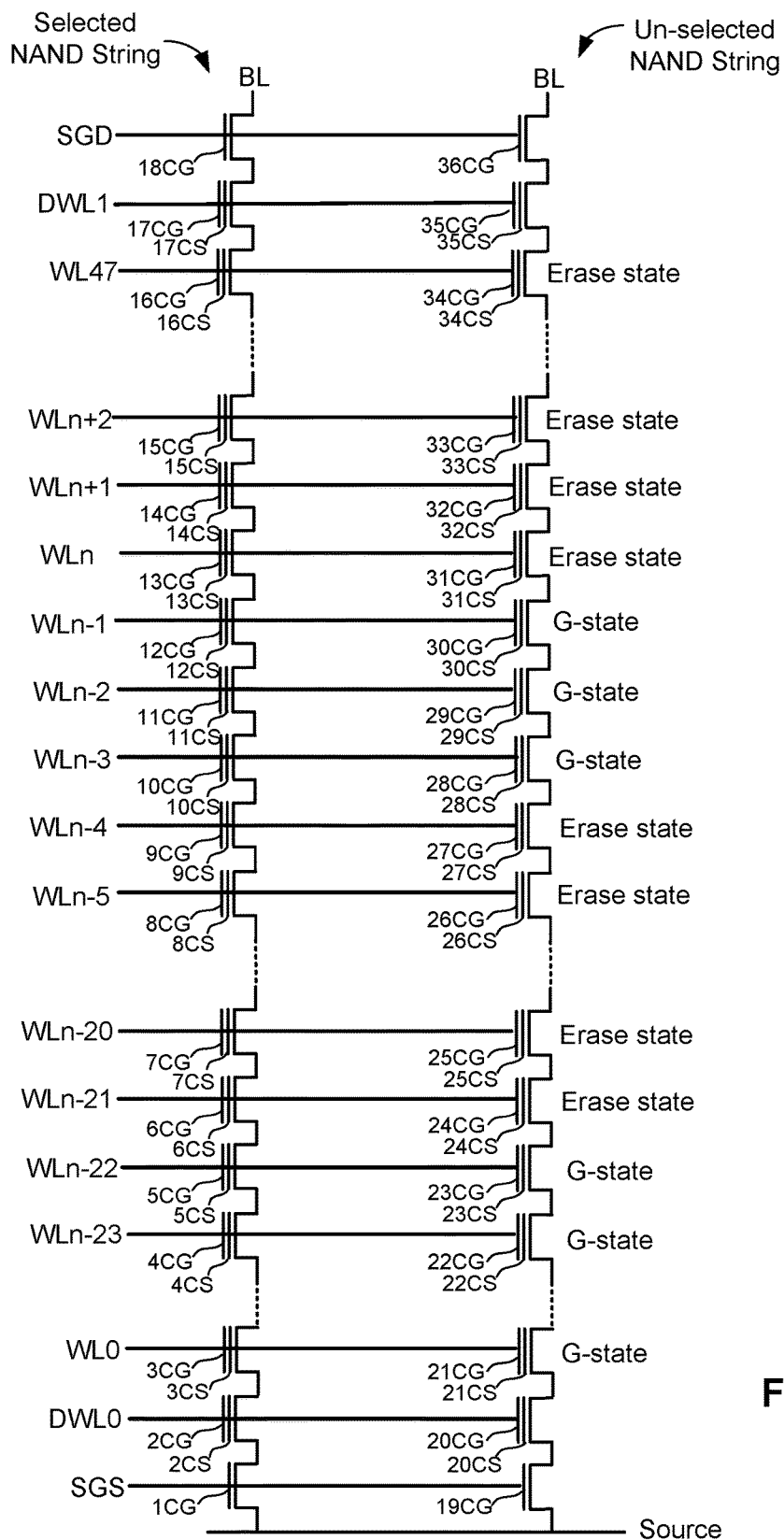
FIG. 1A depicts a circuit diagram of two NAND strings of memory cells.
Figure 1B:
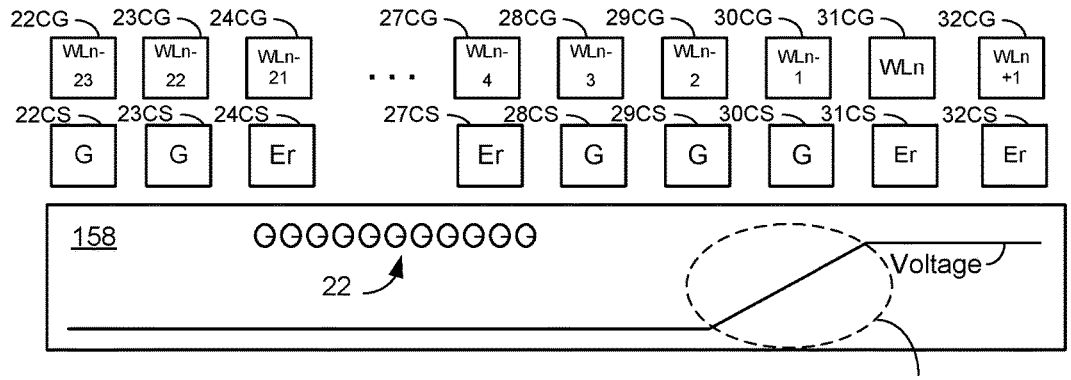
FIG. 1B depicts a cross sectional view of a portion of the inhibited NAND string from FIG. 1A.
Figure 1C:
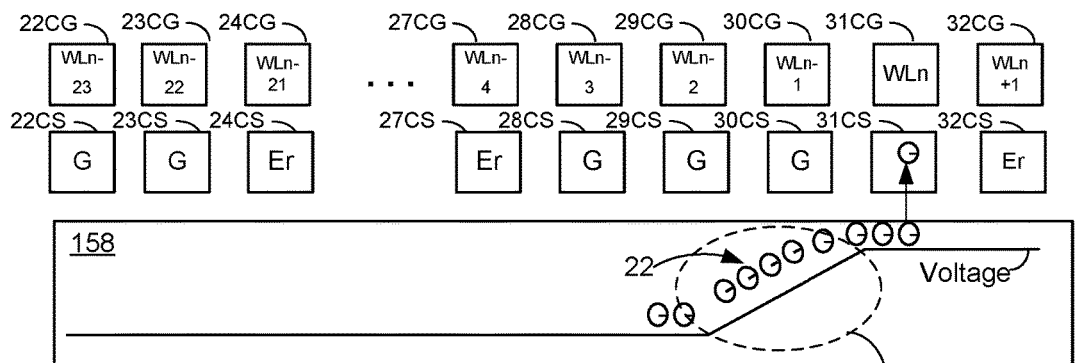
FIG. 1C depicts possible conditions during a channel boosting phase of one possible programming operation of the inhibited NAND string from FIG. 1B.

FIGS. 1A-1C will now be discussed to further illustrate a possible problem of injection of hot electrons from a program inhibited NAND channel to a charge storage region of a memory cell on the NAND string during a programming operation. FIG. 1A depicts a circuit diagram of two NAND strings of memory cells. In one embodiment, the two NAND strings reside within a 3D memory array. Each NAND string has a number of transistors connected in series. Each NAND string has a number of data memory cells, two dummy memory cells, and a select gate at each end of the NAND string. A transistor at one end of the NAND string connects/disconnects the respective NAND string to/from a bit line (BL). These transistors may be referred to as drain-side select gates. More particularly, a drain-side select gate may connect/disconnect a channel of the NAND string to/from a bit line (BL). Each drain-side select gate has a control gate (18CG, 36CG), which is connected to a drain side select line (SGD). Thus, a combination of the voltage applied to SGD and to the respective bit line may connect/disconnect the drain end of the NAND channel to/from the respective bit line. The NAND channel may also be referred to herein as the body of the NAND string. Thus, reference herein to a "NAND channel" is not intended to mean that the body is in a conductive state. In other words, reference herein to a "NAND channel" is not intended to mean that a conductive channel has been formed by application of voltages.

A transistor at the other end of the NAND string connects/disconnects the respective NAND string to/from a source line (Source). These transistors may be referred to as source-side select gates. More particularly, a source-side select gate may connect/disconnect a channel of the NAND string to/from the source line. Each source-side select gate has a control gate (1CG, 19CG), which is connected to a source side select line (SGS). Thus, a combination of the voltage applied to SGD and to the source may connect/disconnect the source end of the NAND string channel to/from the source line.

The data memory cells and the dummy memory cells each have a control gate (CG) and a charge storage region (CS). In one embodiment, the charge storage region is a charge trapping region. The charge trapping region may be formed from a dielectric material. For example, the charge trapping region could comprise silicon nitride. In one embodiment, the charge storage region is a conductive floating gate. For example, the conductive floating gate could be formed from heavily doped polysilicon. Note that the charge storage region may be separated from the control gate by a dielectric or insulator. There may be a dielectric that separates the control gate (CG) and the charge storage region (CS). There may be another dielectric that separates the charge storage region (CS) from the NAND channel.

At the source end, each string has a dummy memory cell with its control gate (2CG, 20CG) connected to a dummy word line (DWL0). Each dummy memory cell at the source end has a charge storage region (2CS, 20CS). At the drain end, each string has a dummy memory cell with its control gate (17CG, 35CG) connected to a dummy word line (DWL1). Each dummy memory cell at the drain end has a charge storage region (17CS, 35CS). The dummy storage elements are not used to stored data, in some embodiments. The dummy memory cells are not required. Also, there could be more than one dummy memory cell at each end of the NAND string.

In this example, each NAND string has 48 data memory cells, although some of the data memory cells are not depicted. The control gates for the data memory cells on the selected NAND string are labeled 3CG-16CG. The control storage regions for the data memory cells on the selected NAND string are labeled 3CS-16CS. The control gates for the data memory cells on the unselected NAND string are labeled 21CG-34CG. The control storage regions for the data memory cells on the selected NAND string are labeled 21CS-34CS. Each data word line (WL0 to WLn+2) is connected to the control gate of one data memory cell on each NAND string. For example, WL0 is connected to 3CG and 21CG; WLn−22 is connected to 5CG and 23CG; WLn−21 is connected to 6CG and 24CG; WLn−20 is connected to 7CG and 25CG; WLn−5 is connected to 8CG and 26CG; WLn−4 is connected to 9CG and 27CG; WLn−3 is connected to 10CG and 28CG; WLn−2 is connected to 11CG and 29CG; WLn−1 is connected to 12CG and 30CG; WLn is connected to 13CG and 31CG; WLn+1 is connected to 14CG and 32CG; WLn+2 is connected to 15CG and 33CG; and WL47 is connected to 16CG and 34CG. A NAND string may have less than or more than forty eight data memory cells. For example, some NAND strings may include 16 memory cells, 32 memory cells, 64 memory cells, 128 memory cells, etc. The discussion herein is not limited to any particular number of memory cells in a NAND string.

Note that although only two NAND strings are depicted as sharing the set of word lines, many more NAND strings may share the word lines. In some embodiments, programming occurs one word line at a time. During a programming operation, a programming voltage (e.g., Vpgm) may be applied to a "selected" word line. The other data word lines may be referred to as "unselected" word lines, which do not receive the programming voltage. Hence, memory cells connected to unselected word lines are not programmed at this time.

In the example of FIG. 1A, word line WLn is the selected word line. Thus, at least some of the memory cells connected to word line WLn may be programmed. However, during a programming operation, memory cells connected to the selected word line that are not to be programmed (e.g., memory cells that have previously completed programming to a target data state) may be inhibited or locked out from programming by boosting associated channel regions of the NAND string. An unselected storage element (or unselected NAND string) may be referred to as a program inhibited or locked out storage element (or program inhibited NAND string) as it is inhibited or locked out from programming during a given programming iteration of a programming operation.

In one embodiment, prior to programming any of the memory cells on the NAND string, the memory cells on the NAND string are first erased. Programming proceeds from the word line nearest the source line to the word line nearest the bit line, in one embodiment. The programming operation increases the threshold voltage of the memory cell, in one embodiment.

FIG. 1A depicts the state of the memory cells on the unselected NAND string when WLn is the selected word line. At this time, all of the memory cells between the selected word line (WLn) and the bit line are still in the erase state. For the sake of illustration, the memory cell at WLn is also in the erase state. The NAND string is inhibited because that memory cell is to stay in the erase state after programming of WLn. Memory cells between the selected word line and the source line are in whatever state they were programmed to when their respective word line was programmed. In this example, the memory cells on word lines WL0 to WLn−22 are programmed to the G-state; the memory cells from WLn−21 to WLn−4 are in the erase state; the memory cells from WLn−3 to WLn−1 are programmed to the G-state. (See FIG. 8 for an example of threshold distributions of memory cells programmed to one of eight different states.)

The foregoing conditions may result in electrons becoming trapped in the program inhibited NAND channel during a portion of the programming operation. For example, electrons could become trapped in a pre-charge phase of the programming operation. The pre-charge phase may be used to boost the channel potential of a program inhibited NAND string. FIG. 1B depicts a cross sectional view of a portion of the inhibited NAND string from FIG. 1A. In this example, a portion of a word line serves as the control gate of a memory cell. For example, a portion of the selected word line (WLn) serves as control gate 31CG. A different portion of the selected word line may serve as the control gate of other memory cells (such as control gate 13CG, see FIG. 1A). FIG. 1B shows the selected word line (WLn), WLn+1 (which neighbors the selected word line on the drain side), WLn−1 to WLn−4, and WLn−21 to WLn−23. Other word lines are not depicted to simplify the diagram. The charge storage region (22CS, 23CS, etc.) of several of the memory cells on the NAND string are also depicted. The letters on the charge storage regions refer to a state to which that respective memory cell has been programmed. In this example, memory cells have a threshold voltage that is either the erase state (Er) or the G-state (G). This is the same data pattern for unselected word lines as shown in FIG. 1A.

FIG. 1B depicts a voltage in the NAND channel 158 during a pre-charge phase of a programming operation. The pre-charge phase may be used to raise the potential of at least a portion of an inhibited NAND channel by a relatively small voltage (e.g., by about 1 volt). During the pre-charge phase, the drain side select gate of the inhibited NAND string may be placed into a conductive state, thereby connecting the inhibited NAND string to the bit line. During the pre-charge phase, voltages are applied to the word lines that might or might not place the respective memory cells of the program inhibited NAND string into a conductive state. Whether the respective memory cells turn on (or are a placed into a conductive state) may depend on their respective threshold voltages, which depend on the data state that they are presently in. Memory cells between the selected word line and the bit line are in the erased state at this time, in this example. All of those memory cells may be placed into the conductive state. Also, some of the memory cells between the selected word line and the source line are in the erased state, in this example. These memory cells may be placed into the conductive state during the pre-charge phase. As a result, a conductive channel may form adjacent to the charge storage regions of those memory cells. In this example, all of the memory cells from WLn−4 to WLn−21 are in the erase state. The conductive channel may contain electrons 22. However, some of the memory cells between the selected word line and the source line are in the G-state, in this example. The G-state memory cells have a high threshold voltage, and are not placed into the conductive state during the pre-charge phase, in this example. In this example, the aforementioned erase state memory cells from WLn−4 to WLn−21 are between G-state memory cells from WLn−1 to WLn−3 and WLn−22 to WL0 (which are off) This may result in electrons 22 being trapped in the NAND channel 158 adjacent to the memory cells from WLn−4 to WLn−21.

Next, the voltage in the NAND channel 158 during the pre-charge phase, as depicted in FIG. 1B, will be discussed. The channel voltage is represented by the line that is closer to the memory cells at WLn and WLn+1 and further from the other memory cells. This is to indicate that the channel potential is highest near WLn and WLn+1, lowest near WLn−3 to WLn−23, and has a potential gradient 97 between WLn and WLn−2. The potential gradient 97 can extend over a greater or lesser lateral extent (by lateral extend it is meant in the direction between the source line and bit line). Stated another way, the potential gradient 97 could have a different slope.

It will be noted that all, or a part, of the NAND channel may be at a floating potential during memory array operations. That is, unlike many 2D NAND channels, which are formed on a substrate, the entire 3D NAND channel is not formed on a substrate. Because a 2D NAND channel (or body) is formed on a substrate, the substrate may be used to provide a voltage to the 2D NAND channel (or body) during memory array operations. However, the only portions of the 3D NAND channel to which a bias is typically directly applied are the source end and the drain end (via the common source line or bit line, respectively). Also, at times either or both the source and/or drain end may be cut off from the source line and/or bit line, respectively. Moreover, some of the memory cells may be conductive (e.g., have a conductive channel formed adjacent to the charge storage region), whereas other memory cells may be non-conductive (e.g., do not have a conductive channel formed adjacent to the charge storage region). Thus, all, or a portion, of the 3D NAND channel may be at a floating potential during memory array operations.

Connecting the NAND string to the bit line may cause the bit line voltage to be passed to a conductive portion of the NAND channel. This may cause the bit line voltage to be passed as far as the portion of the NAND channel adjacent to the selected word line, in this example. However, since the memory cell at WLn−1 is non-conductive at this time (in this example), the bit line voltage is cut off from being passed any further towards the source line. The NAND channel, at least adjacent to the non-conductive memory cells, may be at a floating potential.

Because a portion of the NAND channel is floating, the voltage in the NAND channel adjacent to the non-conductive memory cells may be impacted by the control gate voltage and charge on the charge storage region. Stated another way, the NAND channel voltage may be impacted by the control gate voltage and the threshold voltage of the memory cell. The coupling ratio between the control gate and NAND channel may also impact the NAND channel voltage. If the control gate voltage is at, for example, 0V and the threshold voltage of the memory cell is 5V, then the NAND channel could be at −5V if the coupling ratio is 1. If the coupling ratio is 0.8, then the adjacent NAND channel could be at about −4V. Note that in the present example, almost all of the memory cells between WLn and the source line are in the G-state. As one example, the NAND channel between WLn−2 and the source line may be floating and at about −4V, assuming a coupling ratio of 0.8, word line voltage of 0V and threshold voltage of 5V for the G-state. Note that there is a potential gradient in the NAND channel adjacent to WLn, WLn–1, and WLn–2, in this example. The foregoing examples are just for the sake of illustration. Note that the example threshold voltages of the source side memory cells may represent close to a worst case example. However, the problem of hot electron injection program disturb exists for cases other than the present example.

Note that there is a lateral electric field in the NAND channel near WLn under the example conditions in FIG. 1B. Stated another way there is a potential gradient 97 in the NAND channel near WLn. This lateral electric field may be due to the difference between the relatively high channel potential adjacent to the memory cell connected to WLn (and WLn+1) and the lower channel potential adjacent to G-state memory cells connected to WLn–1, WLn–2, and WLn–3. The potential gradient 97 that is depicted in FIG. 1B is for sake of illustration. The potential gradient 97 could slope more gradually, or at a steeper rate.

FIG. 1C depicts possible conditions during a channel boosting phase of one possible programming operation. During the channel boosting phase, the NAND channel may be cut off from both the bit line and the source line. Thus, the entire 3D NAND channel may be at a floating potential. During the boosting phase, boosting voltages may be applied to the word lines. Since the inhibited NAND channel is floating, the boosting voltages may increase the NAND channel potential due to capacitive coupling between the word lines (or memory cell control gates) and the adjacent floating NAND channel. Under one possible scenario, at some point the boosting voltage on the G-state memory cells at WLn–1 to WLn–3 becomes high enough to put those memory cells into a conductive state, or at least a weakly conductive state. Therefore, the electrons 22 which were trapped in the NAND channel adjacent to WLn–4 to WLn–21 may migrate towards the lateral electric field near WLn. These electrons will be referred to as "residual electrons." Those residual electrons 22 may accelerate in the lateral electric field, thereby becoming "hot electrons". In other words, the residual electrons 22 may gain energy as they accelerate through the potential gradient 97. Additionally, at this time, there may be a vertical electric field between WLn and the channel adjacent thereto. The vertical electric field may result from there being a higher voltage on the control gate 31CG than in the NAND channel adjacent to the memory cell connected to the selected word line. This vertical electric field may allow the hot electrons to be injected into the charge storage region 31CS of the memory cell connected to WLn. Note that the vertical electric field need not be very large for the hot electrons to be injected into the charge storage region 31CS. For example, the vertical electric field can be much smaller than a typical vertical electric field that results from applying a programming voltage to the selected word line. Note that at this time, the memory cell connected to WLn should not receive any programming. Thus, the injected electrons result in program disturb of the memory cell connected to WLn.

In one embodiment, the boosting of the word lines is controlled in a manner that reduces or eliminates the lateral electric field in the NAND channel adjacent to WLn and WLn–1. Therefore, if there are electrons in the NAND channel, the electrons are either not accelerated, or the amount of acceleration is reduced. Therefore, program disturb due to hot electron injection can be reduced or eliminated.

Figure 1D:
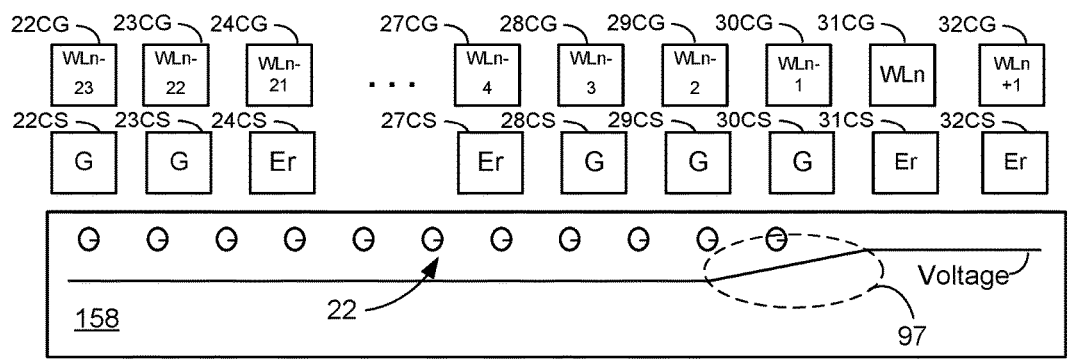
FIG. 1D depicts an example NAND string to depict possible conditions during one embodiment.

FIG. 1D depicts an example NAND string to depict possible conditions during one embodiment. In this example, the memory cells have the same threshold voltages as the example of FIG. 1A-1B. Thus, the NAND channel conditions depicted in FIG. 1B may occur during the pre-charge phase. However, the boosting of the word lines is controlled in a manner that reduces or eliminates the lateral electric field in the NAND channel near the memory cells connected to WLn, in one embodiment. Stated another way, the boosting of the word lines is controlled in a manner that reduces or eliminates the potential gradient 97 in the NAND channel near the memory cells connected to WLn and WLn–1 (and possibly extended to WLn–2 or even further towards the source end of the NAND string), in one embodiment. FIG. 1D shows that the potential gradient 97 is much reduced compared to the example of FIG. 1B. For example, the difference between the channel potential adjacent to the memory cell connected to WLn and the channel potential adjacent to the memory cell connected to WLn–2 (where the potential gradient 97 first reaches its lowest point in this example) is much reduced relative to the conditions of FIG. 1B. Therefore, the strength of the lateral electric field in the NAND channel in the region of the potential gradient 97 is much reduced compared to the conditions of FIG. 1B. Consequently, any residual electrons 22 in the NAND channel do not get accelerated nearly as much compared to the example of FIG. 1C. Because the residual electrons 22 do not gain as much energy, the probability of being injected into the charge storage region 31CS of the memory cell connected to WLn is much lower than the example of FIG. 1C. Therefore, program disturb is reduced or eliminated. Note that although some potential gradient 97 remains in the example of FIG. 1D, it is possible to completely eliminate the potential gradient 97. Also, in some cases, the channel potential adjacent to the memory cell connected to WLn–1 could be greater than the channel potential adjacent to the memory cell connected to WLn at the stage depicted in FIG. 1D.

The following discussion provides details of the construction of example memory devices and of related techniques which address the above and other issues.

Figure 2A:
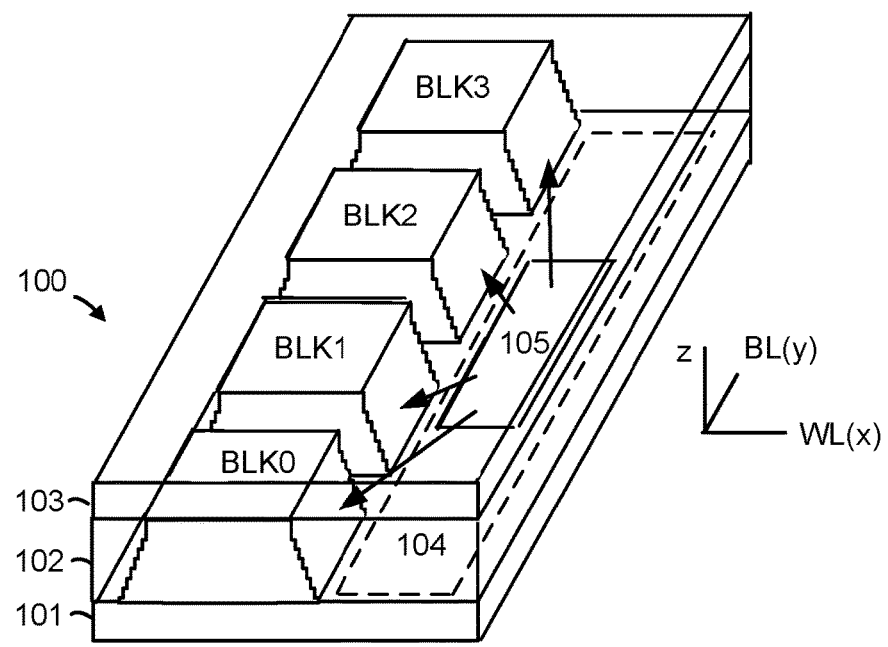
FIG. 2A is a perspective view of a set of blocks in a 3D stacked non-volatile memory device.

FIG. 2A is a perspective view of a set of blocks in a 3D stacked non-volatile memory device. The memory device 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent control gate layers. In one possible approach, the control gate layers of each block at a common height are connected to one another and to a voltage driver. While four blocks are depicted as an example, two or more blocks can be used, extending in the x- and/or y-directions.

Each control gate layer in a block can be divided into regions such as depicted in FIGS. 4A, 4B and 4D, in one possible approach.

The length of the plane, in the x-direction, may represent a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 2B is a functional block diagram of a memory device such as the 3D stacked non-volatile memory device 100 of FIG. 2A. The memory device 100 may include one or more memory die 108. The set of blocks of FIG. 2A can be on one die. The memory die 108 includes a memory structure 126 of memory cells, such as an array of memory cells, control circuitry 110, and read/write circuits 128. In a 3D configuration, the memory structure can include the blocks of FIG. 2A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD select gates and source lines. The sense blocks can include bit line drivers, in one approach. An SGS select is a gate transistor at a source-end of a NAND string, and an SGD select gate is a transistor at a drain-end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

The code is used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The state devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 3 is a block diagram depicting one embodiment of the sense block SB1 of FIG. 2B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 198 coupled between the sets of data latches and the data bus 120. One set of data latches can be provide for each sense module, and may include data latches identified by LDL and UDL. LDL stores a bit for a lower page (LP) of write data, and UDL stores a bit for an upper page (UP) of write data, in a memory which stores two bits of data in each memory cell.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrA, VrB and VrC in FIG. 6B; or VrA, VrB, Vrc, VrD, VrE, VrF, and VrD in FIG. 8) corresponding to the various memory states supported by the memory (e.g., states A, B and C; or A, B, C, D, E, F, and G), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the sets of data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 4A depicts a top view of an example word line layer 400 of the block BLK0 of FIG. 2A, in a straight NAND string embodiment. As mentioned, a word line layer in each block in FIG. 2A can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a connector 413. The last region of a word line layer in a block can be connected to a first region of a word line layer in a next block, in one approach. The connector, in turn, is connected to a voltage driver for the word line layer. The region 406 has example memory holes 410 and 411 along a line 412. See also FIG. 4C. The region 407 has example memory holes 414 and 415. The region 408 has example memory holes 416 and 417. The region 409 has example memory holes 418 and 419.

Each circle represents the cross-section of a memory hole at a word line layer or select gate layer. Each circle can alternatively represent a memory cell which is provided by the materials in the memory hole and by the adjacent word line layer.

Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

FIG. 4B depicts a top view of an example SGD layer 420, consistent with FIG. 4A.

The SGD layer is divided into regions 426, 427, 428 and 429. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

Figure 4C:
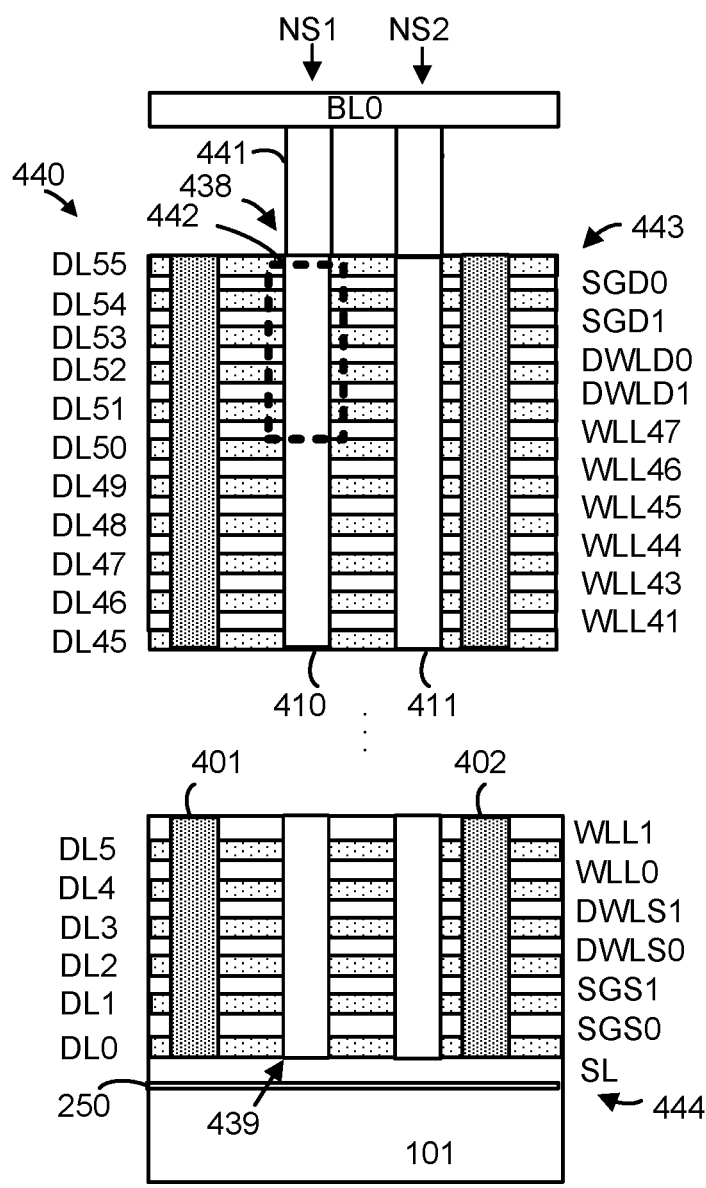
FIG. 4C depicts an embodiment of a stack 440 showing a cross-sectional view along line 412 of FIG. 4A and line 412a of FIG. 4B.

The region 426 has the example memory holes 410 and 411 along a line 412a which is coincident with a bit line BL0. See also FIG. 4C. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4A are also depicted, as they extend vertically through the stack. The bit lines can be numbered in a sequence BL0-BL23 across the SGD layer 420 in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 4C depicts an embodiment of a stack 440 showing a cross-sectional view along line 412 of FIG. 4A and line 412a of FIG. 4B. The stack 440 has alternating conductive and insulating layers. The insulating layers are labeled DL0-DL55, and may be a dielectric material such as silicon oxide. The conductive layers include: two SGD layers, two SGS layers, four dummy word line layers DWLD0, DWLD1, DWLS0 and DWLS1, in addition to the data word line layers WLL0-WLL47. The conductive layers could be formed from, for example, tungsten. Columns of memory cells corresponding to NAND strings NS1 and NS2 are depicted in the multi-layer stack. The stack includes a substrate 101, an insulating film 250 on the substrate, and a portion of a source line SL. NS1 has a source-end 439 at a bottom 444 of the stack and a drain-end 438 at a top 443 of the stack. The metal-filled slits 401 and 402 from FIGS. 4A and 4B are also depicted. A portion of the bit line BL0 is also depicted. A conductive via 441 connects the drain-end 438 to BL0. A region 442 of the stack is shown in greater detail in FIG. 5.

FIG. 4D depicts an alternative view of the select gate layers and word line layers of the stack 440 of FIG. 4C. The SGD layers SGD0 and SGD0 each includes parallel rows of select gate lines associated with the drain-side of a set of NAND strings. For example, SGD0 includes drain-side select gate regions 426, 427, 428 and 429, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 450, 451, 452 and 453. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers. For example, WLL10 comprises word line layer regions 406, 407, 408 and 409, consistent with FIG. 4A.

Below the data word line layers are the source-side dummy word line layers.

Below the source-side dummy word line layers are the SGS layers. The SGS layers SGS0 and SGS1 each includes parallel rows of select gate lines associated with the source-side of a set of NAND strings. For example, SGS0 includes source-side select gate lines 454, 455, 456 and 457. Each select gate line can be independently controlled, in one approach. Or, the select gate lines can be connected and commonly controlled.

FIG. 5 depicts a view of the region 442 of FIG. 4C. SGD select gates 480 and 481 are provided above dummy memory cells 482 and 483 and a data memory cell MC. A number of layers can be deposited along the sidewall (SW) of the memory hole 410 and/or within each word line layer, e.g., using atomic layer deposition. For example, each column (e.g., the pillar which is formed by the materials within a memory hole) can include a charge-trapping layer or film 463 such as SiN or other nitride, a tunneling layer 464, a polysilicon body or channel 465, and a dielectric core 466. A word line layer can include a blocking oxide 470, a block high-k material 460, a metal barrier 461, and a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

The memory cells in FIG. 5 are one embodiment of memory cells from FIGS. 1A, 1B, and 1D. Thus, control gates 490, 491, 492, 493 and 494 are one embodiment of control gates 1CG to 36CG; together blocking oxide 470 and block high-k material 460 are one embodiment of a dielectric layer between control gates 1CG to 36CG and either word lines (DWL0, WL0, WL47, DWL1) or select lines (SGS, SGD); charge-trapping layer or film 463 is one embodiment of charge storage regions 2CS to 17CS and 20CS to 35CS); tunneling layer 464 is one embodiment of gate dielectric layer adjacent to the channel 158; and polysilicon body or channel 465 is one embodiment of channel 158.

When a memory cell of FIG. 5 is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

The NAND string can be considered to have a floating body channel because the length of the channel is not formed on a substrate. Further, the NAND string is provided by a plurality of word line layers above one another in a stack, and separated from one another by dielectric layers (e.g., DL0-DL55).

Figure 6A:
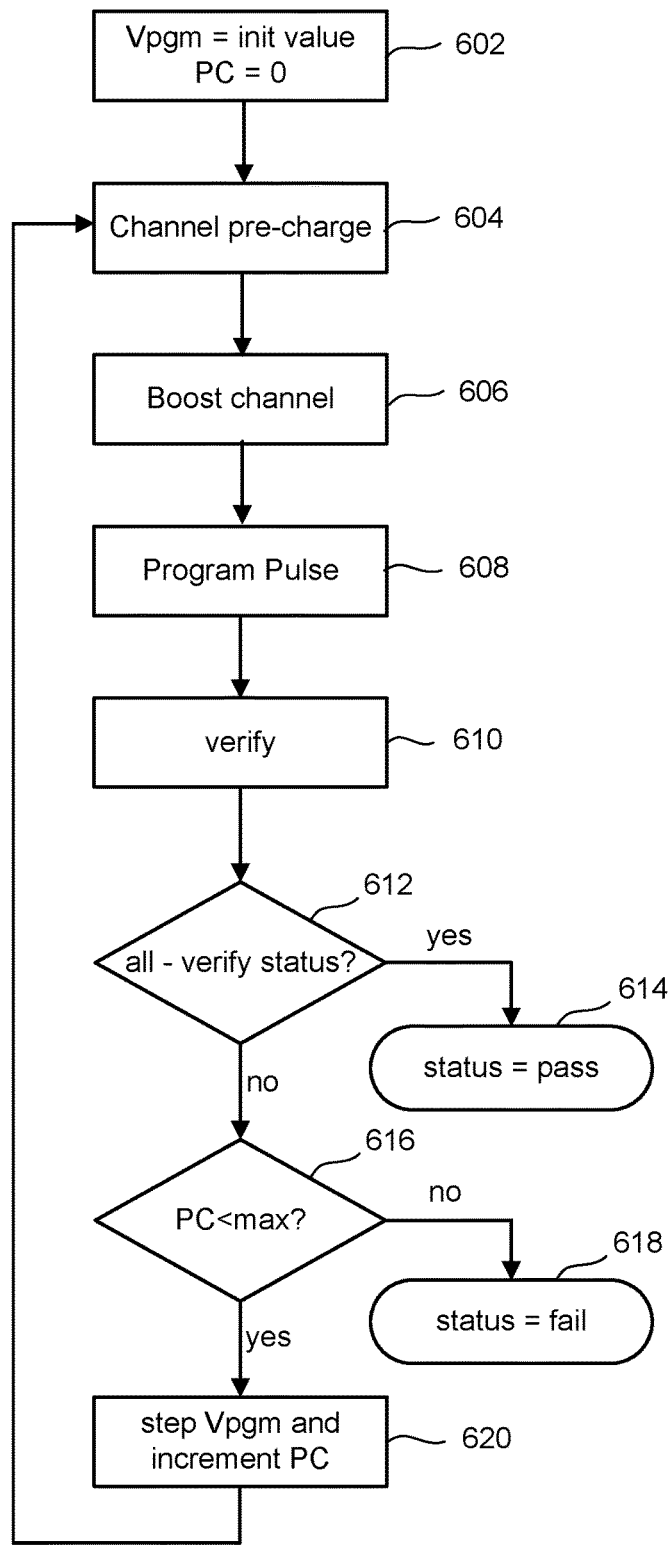
FIG. 6A is a flowchart describing one embodiment of a programming process.

FIG. 6A is a flowchart describing one embodiment of a programming process. In one embodiment, memory cells in a 3D NAND memory array are programmed. The process of FIG. 6A may be performed by a control circuit, which may include various elements shown in FIG. 2B. In step 602, the program voltage ($V_{PGM}$) is set to an initial value. This is the program voltage that will be applied to the selected word line for the first iteration of the process. This program voltage will be stepped up during the process. Also, in step 602, a program counter (PC) is initialized to zero. The program counter tracks how many program pulses have been applied, such that programming can be aborted if the memory cell does not program within an allowed number of program pulses. In one embodiment, an initial value for boosting voltages are established in step 602. The value of boosting voltages may depend on the magnitude of the program voltage. For example, as the program voltage increases in magnitude during the process, the magnitude of boosting voltages can also be stepped up.

The value of boosting voltages may depend on the location of the word line relative to the word line selected for programming. In one embodiment, the magnitude of the boosting voltage (on any given program loop) for WLn, WLn-1, and WLn+1 are the same and are larger than those of WLn-2, WLn-3 and other unselected word lines on the source side of the selected word line. In one embodiment, the magnitude of the boosting voltage for WLn-2 is the same as WLn-1, WLn, and WLn+1 (other unselected word lines on the source side of WLn may have a smaller magnitude boosting voltage.). In one embodiment, the magnitude of the boosting voltage for WLn-3, WLn-2 are the same as WLn-1, WLn, and WLn+1 (other unselected word lines on the source side of WLn may have a smaller magnitude boosting voltage.). Using a slightly greater magnitude boosting voltage on WLn-2, and optionally on WLn-3, can help to reduce the potential gradient 97 in the NAND channel near the selected word line.

In step 604, channels of program inhibited NAND strings are pre-charged. This is referred to herein as a pre-charge phase. Step 604 may include establishing one or more pre-charge voltages in a given program inhibited NAND string. Stated another way, step 604 may result in one or more pre-charge voltages in a given program inhibited NAND string. Thus, the magnitude of the voltage is not required to be uniform throughout the channel from the source line to the bit line. Step 604 may result in a potential gradient in a program inhibited NAND channel near the word line that is selected for programming.

In step 606, the voltage in channels of program inhibited (or unselected) NAND strings is boosted (this may simply be referred to as "channel boosting"). A program inhibited NAND string is one that does not have a memory cell being programmed. That is, the program pulse to be applied to the selected word line should not alter the threshold voltage of any memory cells on an unselected NAND string. Significantly, the memory cell connected to the selected word line should not have its threshold voltage altered by the program pulse. Boosting the channels of program inhibited NAND strings helps to prevent program disturb.

Embodiments disclosed herein control the boosting of a program inhibited NAND channel in a manner to reduce or eliminate a lateral electric field in the program inhibited NAND channel adjacent to the selected word line. Stated another way, embodiments disclosed herein control the boosting of the program inhibited NAND channel in a manner to reduce or eliminate a potential gradient in the program inhibited NAND channel adjacent to the selected word line. Eliminating or at least reducing the lateral electric field (or the potential gradient) prevents or at least reduces program disturb of the memory cell (on the program inhibited NAND string) connected to the selected word line.

In step 608, a program pulse (e.g., programming voltage) is applied to the selected word line while the channel of the program inhibited NAND string is boosted. Also, a "program enable" voltage is applied to bit lines associated with NAND strings having a memory cell to receive programming. A "program inhibit" voltage is applied to bit lines associated with NAND strings having a memory cell to receive programming. By receiving programming, it meant that the memory cell should have its threshold voltage altered. For example, bit lines associated with memory cells that are not being programmed ("inhibited" or "unselected" bit lines) are kept at a program inhibit voltage. For some architectures, the program inhibit voltage could be about 2.2V, but this could vary based on design. Bit lines associated with memory cells that are being programmed ("selected" bit lines) are kept at a program enable voltage. For some architectures, the program enable voltage could be about 0V, but this could vary based on design.

In step 610, a verification process is performed. In step 612, it is determined whether the threshold voltage of a memory cell was verified to be at the final target threshold voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 612 is referring to all states having completed programming.

If verification passes, the programming process is completed successfully (status=pass) in step 614. If all of the memory cells are not all verified, then it is determined whether the program counter (PC) is less than a maximum value such as 20. If the program counter (PC) is not less than max (step 616), then the program process has failed (step 618). If the program counter (PC) is less than a maximum value (e.g., 20), then the program counter (PC) is incremented by 1 and the program voltage is stepped up to the next value in step 620. In some embodiments, the boosting voltages are also stepped up in step 620. Subsequent to step 620, the process loops back to step 604 to prepare for and apply the next program pulse to the selected word line.

Figure 6B:
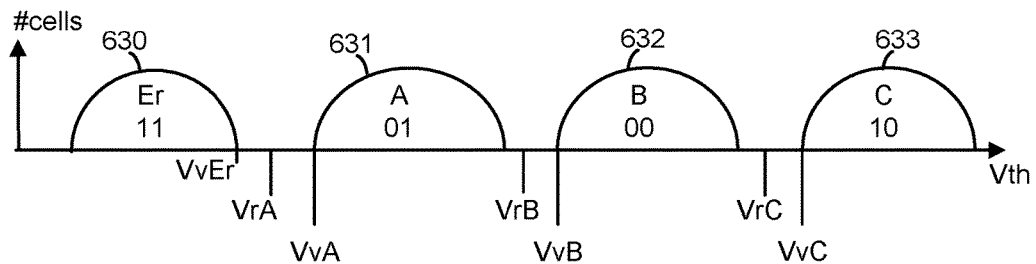
FIG. 6B depicts a threshold voltage (Vth) distribution and example read and verify voltages for a set of memory cells.

The result of the programming process of FIG. 6A is to program each memory cell to one of a number of "threshold voltage distributions." FIG. 6B depicts a threshold voltage (Vth) distribution and example read and verify voltages for a set of memory cells. The horizontal axis represents Vth and the vertical axis represents a number of memory cells on a logarithmic scale. The Vth distributions are shown in a simplified form for clarity.

In one approach, a one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in an erased state at the beginning of the programming pass.

Example Vth distributions for the memory cell array are provided for a case where each memory cell stores two bits of data in one of four possible Vth ranges. Vth distributions 631, 632 and 633 represent target data states A, B and C, respectively, which are reached by memory cells when their Vth exceeds the verify voltage VvA, VvB or VvC, respectively. A verify operation or test is performed to determine whether the Vth of a memory cell exceeds a verify voltage. VvEr is an erase verify voltage for the erase state represented by Vth distribution 630.

After the programming pass is completed, the data can be read from the memory cells using read reference voltages VrA, VrB and VrC which are between the Vth distributions. By testing whether the Vth of a given memory cell is above or below one or more of the read reference voltages, the system can determine the data state which is represented by a memory cell.

Figure 7A:
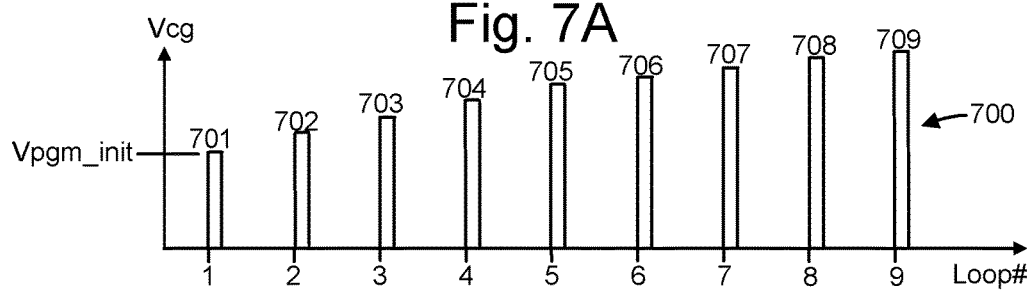
FIG. 7A depicts a set of program voltages in a programming operation.
Figure 7B:
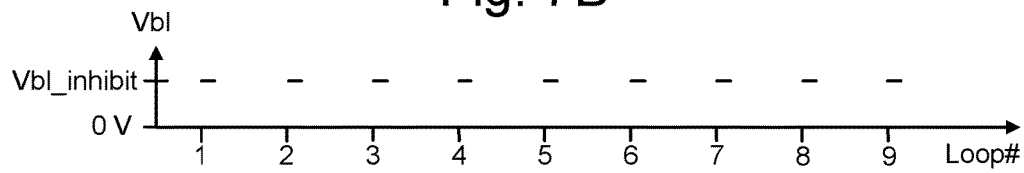
FIG. 7B depicts a set of bit line voltages in a programming operation, consistent with FIG. 7A.
Figure 7C:
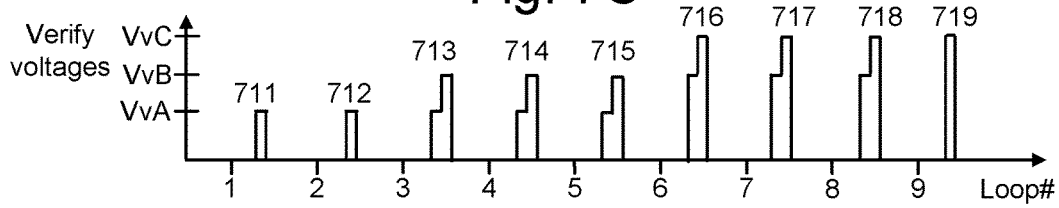
FIG. 7C depicts a set of verify voltages in a programming operation, consistent with FIG. 7A.

FIG. 7A depicts a set of program voltages in a programming operation. The vertical axis depicts Vcg, a control gate or word line voltage, and the horizontal axis depicts time or program loop number (e.g., program-verify iteration number). A one pass programming operation with four data states is depicted in FIG. 7A-7C. Other options are possible. The programming operation comprises a series of waveforms 700 comprising program voltages 701-709. Incremental step pulse programming is performed, such that Vpgm begins at an initial level, Vpgm_init and increases step-wise in each program loop. This example also performs verify tests based on the program loop (see FIG. 7C). For example, the A state cells are verified in loops 1 and 2, the A and B state cells are verified in loops 3-5, the B and C state cells are verified in loops 6-8 and the C state cells are verified in loop 9. The horizontal axes of FIG. 7A-7C are time-aligned.

FIG. 7B depicts a set of bit line voltages in a programming operation, consistent with FIG. 7A. Vb1_inhibit may be applied to the bit lines for the memory cells with a lockout or inhibit status (e.g., the erased state cells or the memory cells which have completed programming to a target data state). Vb1=0 V may be applied to the memory cells with a program status.

FIG. 7C depicts a set of verify voltages in a programming operation, consistent with FIG. 7A. Waveforms 711 and 712 in program loops 1 and 2, respectively, have a magnitude of VvA. Waveforms 713, 714 and 715 in program loops 3, 4 and 5, respectively, have a magnitude of VvA and VvB. Waveforms 716, 717 and 718 in program loops 6, 7 and 8, respectively, have a magnitude of VvB and VvC. Waveform 719 in program loop 9 has a magnitude of VvC. Specifically, in program loops 1 and 2, sensing occurs for the A state cells at VvA. In program loops 3, 4 and 5, sensing occurs for the A state cells at VvA and for the B state cells at VvB. In program loops 6, 7 and 8, sensing occurs for the B state cells at VvB and for the C state cells at VvC. In program loop 9, sensing occurs for the C state cells at VvC. This approach minimizes the number of verify operations by considering that memory cells with lower target data states will pass a verify test earlier in the programming operation than memory cells with higher target data states.

Figure 8:
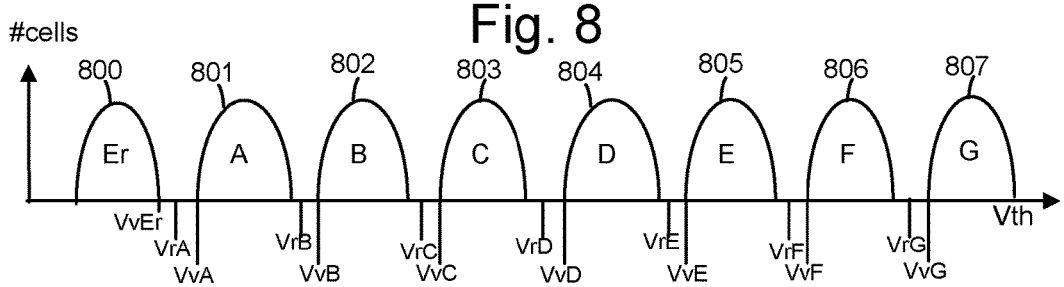
FIG. 8 depicts threshold voltage distributions when three bits are stored per memory cell.

The memory cells may be programmed to more or fewer than four states. In the example of FIG. 6B, each memory cell could store two bits. Memory cells could store more or fewer than two bits each. FIG. 8 depicts threshold voltage distributions when three bits are stored per memory cell. In this case, there are eight threshold voltage distributions 800-807, representing an erase state (Er), and states A through G. Verify voltages Vva, VvB, VvC, VvD, VvE, VvF, and VvG are depicted. Read reference voltages Vra, VrB, VrC, VrD, VrE, VrF, and VrG are depicted. Programming and reading may be similar to that described in the example of storing and sensing two bits per memory cell.

Figure 9A:
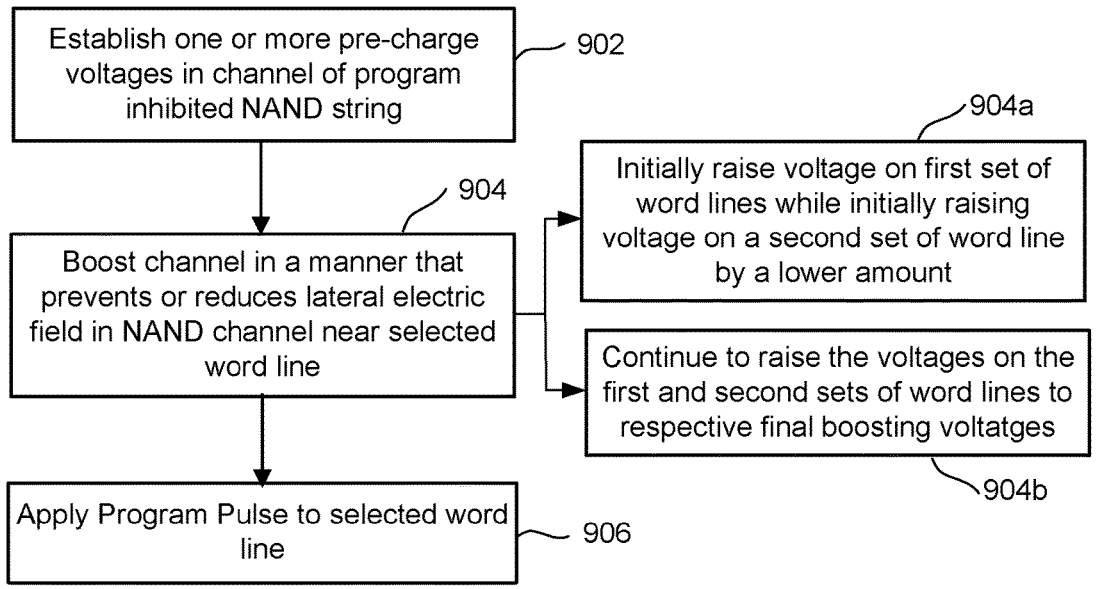
FIG. 9A is a flowchart of one embodiment of a process of programming non-volatile memory cells.

FIG. 9A is a flowchart of one embodiment of a process of programming non-volatile memory cells. The process of FIG. 9A may be performed by a control circuit, which may include various elements shown in FIG. 2B. The process discusses a first set of word lines and a second set of word lines. The boosting voltages on the first and second sets of word lines may be controlled in a manner to prevent or reduce program disturb due to hot electron injection. In one embodiment, the first set of word lines includes WLn−1, and the second set of word lines includes WLn and WLn+1. Here, the notation is that WLn is the word line selected for programming, WLn−1 is the word line immediately adjacent to WLn towards the source line, and WLn+1 is the word line immediately adjacent to WLn towards the bit line. The first set of word lines could include one or more additional word lines that are contiguous to the selected word line on the source side of the selected word line. For example, the first set of word lines could include WLn−1 and WLn−2. The first set of word lines could include WLn−1, WLn−2, and WLn−3. The first set of word lines could include all unselected word lines on the source line of the selected word line. The second set of word lines could include one or more additional unselected word lines that are contiguous to the selected word line on the drain side of the selected word line. For example, the second set of word lines could include all unselected word lines on the bit line of the selected word line. Note that unselected word lines is referring to unselected data word lines. Dummy word lines might or might not be included in the first and second sets of word lines.

Step 902 includes establishing one or more pre-charge voltages in a channel of a program inhibited NAND string. Step 902 includes applying a voltage to word lines associated with the program inhibited NAND strings. The magnitude of this voltage is 0V, in one embodiment. The magnitude could be greater than 0V. It is not required that each word line receive the same magnitude voltage. In one embodiment, the selected word line (e.g., WLn) receives a different magnitude voltage from the unselected word lines. Note that a portion of each of the word lines may serve as a control gate for one of the memory cells on program inhibited NAND string.

For the sake of discussion, an example will be used in which, during the pre-charge phase, the control circuit applies a first voltage to a selected word line (e.g., WLn), a second voltage to a first unselected word line (e.g., WLn−1) that neighbors the selected word line towards the source end of a program inhibited NAND string, and a third voltage to a second unselected word line (e.g., WLn+1) that neighbors the selected word line towards the drain end during a pre-charge phase of a programming operation. The first, second, and third voltages could all be the same, all different, any two of the three the same.

FIG. 1B depicts one example of one or more pre-charge voltages in a program inhibited NAND channel during a pre-charge phase. Note that the one or more pre-charge voltages result in a potential gradient 97. In this example, the potential gradient 97 is near the memory cell that is connected to WLn. Thus, residual electrons 22 that are accelerated in the potential gradient 97 could possibly be injected into the charge storage region 31CS of the memory cell that is connected to WLn. In the example of FIG. 1B, the potential gradient 97 extends (in the NAND channel) from approximately the memory cell connected to WLn to the memory cell connected to WLn−2.

Step 904 includes boosting the channel potential of the program inhibited NAND string. Step 904 includes boosting the channel potential in a manner that prevents or reduces a lateral electric field in the NAND channel near the selected word line, in one embodiment. Step 904 includes boosting the channel potential in a manner that prevents or reduces a potential gradient 97 in the NAND channel near the selected word line, in one embodiment. Stated another way, step 904 includes boosting the channel potential in a manner that prevents or reduces a potential gradient 97 in the NAND channel adjacent to one or more memory cells that are immediately adjacent to WLn on the source side of the program inhibited NAND string. For example, referring back to FIG. 1D, the potential gradient 97 may be eliminated, or at least reduced, compared to FIG. 1B. Step 904 includes applying boosting voltages to word lines while the channel of the program inhibited NAND channel is floating, in one embodiment.

In one embodiment, step 904 includes initially increasing a voltage that is on the first set of word lines by a greater amount than initially increasing a voltage that is on the second set of word lines. For example, step 904 may includes initially raising the voltage on the first set of word lines from the pre-charge voltage by a first amount while initially raising the voltage on the second set of word lines from the pre-charge voltage by a second amount that is less than the first amount. For example, the control circuit may initially raise the second voltage on WLn−1 by a fourth voltage and initially raise the first voltage on WLn and the third voltage on WLn+1 by less than the fourth voltage during the boosting phase of the programming operation.

Initially raising the voltage on the first set of word lines, in one embodiment, raises the voltage on the first set of word lines to a sufficient level such that the memory cells connected to the first set of word lines are at least weakly conductive. In one embodiment, step 904 includes initially raising the voltage on the first set of word lines by more than initially raising the voltage on the second set of word lines by the time that at least one memory cell adjacent to the memory cell connected to the selected word line becomes conductive. Referring back to FIGS. 1B and 1D, so long as the memory cells at WLn−1 to WLn−3 are non-conductive, the residual electrons 22 do not have a free path to the potential gradient 97. However, once the memory cells at WLn−1 to WLn−3 are at least weakly conductive, the residual electrons 22 could migrate to the potential gradient 97. In one embodiment, by the time in the boosting phase that the memory cells at WLn−1 to WLn−3 are at least weakly conductive, the potential gradient 97 has been reduced by raising the voltage on the first set of word lines (e.g., WLn−1, WLn−2, WLn−3) by more than the voltage on the second set of word lines (e.g., WLn, WLn+1) has been raised. Thus, note that for a brief period of time (e.g., while WLn−1 to WLn−3 are still non-conductive) it may be that the voltage on the second set of word lines could increase by more than the voltage on the first set of word lines.

Figure 9B:
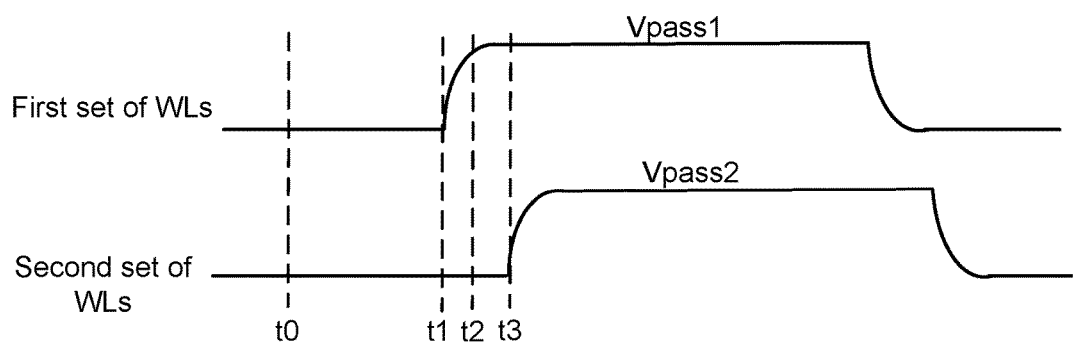
FIGS. 9B-9D are timing diagrams of embodiments of voltages applied to the first and second sets of word lines.

Step 904 includes steps 904a and 904b, in one embodiment. In one embodiment, step 904a includes starting to raise the voltage on the first set of word lines (e.g., from the voltage just prior to the boosting phase) prior to starting to raise the voltage on the second set of word lines (e.g., from the voltage just prior to the boosting phase). FIG. 9B is a timing diagram of one embodiment of voltages applied to the first and second sets of word lines. At time t0, the voltage on both the first and second sets of word lines is at a "pre-charge voltage." This could be 0V. It is not required that the word lines in the first set be at the some voltage as the word lines in the second set. Also, it is not required that all of the word lines in the first set be at the same voltage. Likewise, it is not required that all of the word lines in the second set be at the same voltage. Thus, the voltage at time t0 simply refers to whatever voltage that the word line was at during the pre-charge phase occurs.

In the example of FIG. 9B, the boosting phase begins at time t1. Also, the pre-charge phase ends at time t1. At time t1, the voltage on the first set of word lines starts to increase towards Vpass1. For example, at time t1 the control circuit in the memory device begins to increase the voltage on the first set of word lines. It is not until time t3 that the voltage on the second set of word lines starts to increase towards Vpass2. For example, at time t3 the control circuit in the memory device begins to increase the voltage on the second set of word lines. Thus, there is a delay in starting to increase the voltage on the second set of word lines. Note that it is not required that the magnitude for Vpass1 for the word lines in the first set be the same as Vpass2 for the word lines in the second set. Also, it is not required that the voltage for Vpass1 be the same for all word lines in the first set. Likewise, it is not required that all of the word lines in the second set have the same magnitude Vpass2. Thus, Vpass may refer to whatever final magnitude boosting voltage is applied to a given word line.

By time t2, the voltage on the first set of word lines has increased by a sufficient amount to make the memory cells connected to the first set of word line at least weakly conductive, in this example. Thus, it is possible for residual electrons 22 to migrate to the potential gradient 97. However, by this time, the voltage on the first set of word lines has been increased by more (from the voltage just prior to the boosting phase, or alternatively stated from the voltage at the end of the pre-charge phase) than the voltage on the second set of word lines. In fact, in the entire zone between t1 and t2, the voltage on the first set of word lines has been increased by more than the voltage on the second set of word lines. Thus, initially the voltage on the first set of word lines has been increased by a greater amount than the voltage increase on the second set of word lines. Note that Vpass2 on the second set of word lines could be greater than Vpass1 on the first set of word lines. Thus, it is possible for final increase of voltage on the second set of word lines to be greater than the final increase in voltage on the first set of word lines.

Note that in the example discussed with respect to FIG. 9B, beginning to ramp up of the boosting voltage on the second set of word lines occurs after time t2 (when the memory cells connected to the word lines in the first set become weakly conductive in this example). However, the voltage to the second set of words lines could alternatively begin to be ramped up prior to time t2. That is, the voltage to the second set of words lines can begin to be ramped up prior to the memory cells connected to the word lines in the first set become at least weakly conductive.

Figure 9C:
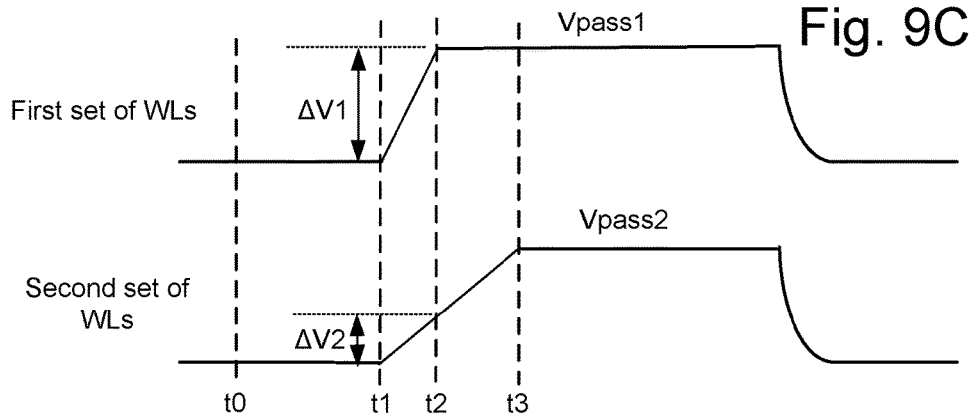
Figure 9D:
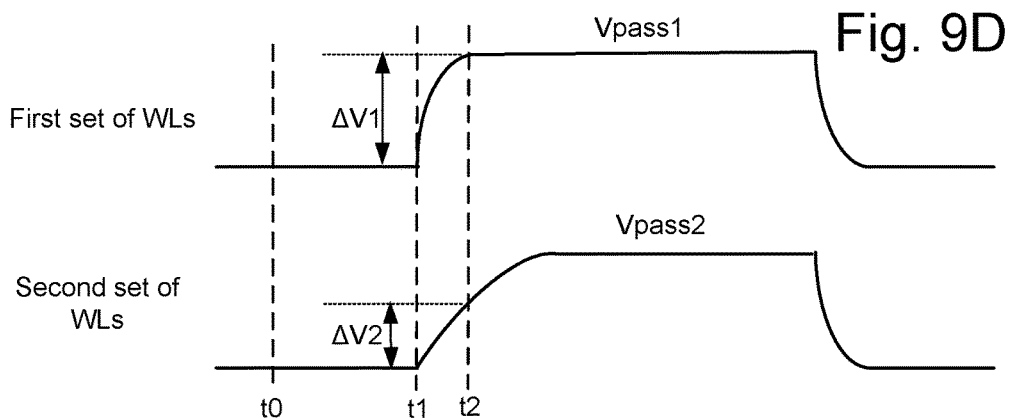

In one embodiment, step 904a includes raising the voltage on the first set of word lines at a faster rate than raising the voltage on the second set of word lines. FIG. 9C and FIG. 9D are timing diagrams to illustrate two embodiments of raising the voltage on the first set of word lines at a faster rate than raising the voltage on the second set of word lines. For both FIGS. 9C and 9D, at time to, the voltage on both the first and second sets of word lines is at a "pre-charge voltage." This is similar to the example of FIG. 9B. The pre-charge phase ends and the boosting phase begins at time t1 for both FIGS. 9C and 9D. At time t1, the voltage on both the first and second sets of word lines starts to increase towards Vpass (i.e., to either Vpass1 or Vpass2). However, the voltage on the first set of word lines increases at a faster rate than the voltage on the second set of word lines. The rate of increase may be measured in terms of volts per unit time.

In FIG. 9C, the ramping of the boosting voltages is performed at a constant rate. Thus, the ramp rate may be defined as the slope of the voltage waveform from the start of the ramp to the end of the ramp. For example, for the first set of word lines, the ramp rate is defined by: Vpass1/(time t2−time t1). For the second set of word lines, the ramp rate is defined by: Vpass2/(time t3−time t1). The slope (or ramp rate) for ramping up Vpass1 is greater than the slope for ramping up Vpass2 in this embodiment.

The boosting voltages do not need to be ramped at a constant rate. FIG. 9D shows voltage waveforms for which the rate of increase is not constant. Note that the time t2 in FIG. 9D does not necessarily correspond to time t2 in FIG. 9C. Note that the slope of the voltage waveform on the first and second sets of word lines may change over time. For example, initially the slope may be quite steep, with the slope decreasing as the voltage nears the final value (e.g., Vpass1 or Vpass2). The slope can be defined as an "instantaneous slope," which refers to the slope of the voltage waveform at one instant in time. The slope can also be defined as an "average slope," which refers to the slope of the voltage waveform between two points in time. The average slope may depend on which two points in time are selected. The rate at which a boosting voltage is ramped is defined herein as the average slope from the time the boosting voltage first starts to ramp up to when the boosting voltage reaches its final value.

In one embodiment, the average slope of a voltage waveform, such as the voltage waveform applied to the first and second sets of word lines in FIG. 9C or 9D, may be generated using a voltage regulator. The average slope of the voltage waveform may be generated using a configurable RC network at the output of the voltage regulator or using a tunable resistor or transistor in series with the voltage regulator. In one example, the tunable resistor may be adjusted or set such that the average slope of the output voltage waveform from the voltage regulator matches the average slope of the desired voltage waveform. In one embodiment, the voltage waveform may be generated using a voltage regulator in which an internal regulation point within the voltage regulator or a node within the voltage regulator through which closed-loop feedback is used to generate the desired voltage waveform may be adjusted over time using a predetermined waveform schedule (e.g., stored in a non-volatile memory) in order to generate the desired voltage waveform with the desired average slope. The output of the voltage regulator may be buffered (e.g., using a unity gain buffer) prior to driving one or more word lines (e.g., prior to driving the two neighboring unselected word lines that are adjacent to the selected word line).

At some point during the ramping of FIG. 9C or 9D, the voltage on the first set of word lines may have increased by a sufficient amount to make the memory cells connected to the first set of word line at least weakly conductive. Thus, it is possible for residual electrons 22 to migrate to the potential gradient 97. However, by this time the voltage on the first set of word lines has been increased by more (from the pre-charge voltage) than the voltage on the second set of word lines. For example, at time t2 in 9D, the voltage increase for the first set of word lines from time t1 is $\Delta V1$. At time t2 in FIG. 9D, the voltage increase for the second set of word lines from time t1 is $\Delta V2$, where $\Delta V2$ is less than $\Delta V1$. Thus, having a faster rate of increase for the first set of word lines has resulted in the voltage on the first set of word lines increasing by more than the voltage increase on the second set of word lines. Similar reasoning applies for the example of FIG. 9C. Note that $\Delta V1$ and $\Delta V2$ may have different values in FIG. 9C than in FIG. 9D.

In some cases, prior to reaching Vpass1, the voltage on the first set of word lines may have increased by a sufficient amount to make the memory cells connected to the first set of word line at least weakly conductive. In this case, the voltage increase for the first set of word lines is larger than the voltage increase for the second set of word lines, in one embodiment. For the example of FIG. 9D this means that the average slope between time t1 and when the memory cells connected to the first set of word line are at least weakly conductive is greater than the average slope of the Vpass2 ramp rate on the second set of word lines.

Note that due to non-idealities in circuit performance, small delays in transmitting signals, etc., it is possible for the voltage on the second set of word lines to begin to ramp up slightly prior to the first set of word lines. However, very quickly the increase of the voltage to the first set of word lines should overtake the voltage increase on the second set of word lines. Thus, it will be understood that the overall effect of being able to reduce or eliminate the potential gradient in the NAND channel can be achieved even with such non-idealities in circuit performance. So long as the memory cells in the first set are non-conductive, the residual electrons 22 do not have a free path to the potential gradient 97. However, once the memory cells in the first set are at least weakly conductive, the residual electrons 22 could migrate to the potential gradient 97. In one embodiment, by the time that the memory cells in the first set are at least weakly conductive, the potential gradient 97 has been reduced by raising the voltage on the first set of word lines (e.g., WLn−1) by more than the voltage on the second set of word lines (e.g., WLn, WLn+1) has been raised. Thus, note that for a brief period of time (e.g., while the memory cell connected to WLn−1 is still non-conductive) it may be that the voltage on the second set of word lines could increase by more than the voltage on the first set of word lines. Thus, it is possible for the voltage on the second set of word lines to start to ramp up slightly prior to the ramping of the voltage on the first set of word lines, and to still meet the condition of the raising the voltage on the first set of word lines from the pre-charge voltage by a first amount while initially raising the voltage on the second set of word lines from the pre-charge voltage by a second amount that is less than the first amount.

Step 904b includes continuing to raise the voltages on the first and second sets of word lines to respective final boosting voltages. In one embodiment, the voltage on the first set of word lines is raised to Vpass1 (see FIG. 9B, 9C, or 9D as examples). In one embodiment, the voltage on the second set of word lines is raised to Vpass2 (see FIG. 9B, 9C, or 9D, as examples).

Figure 9E:
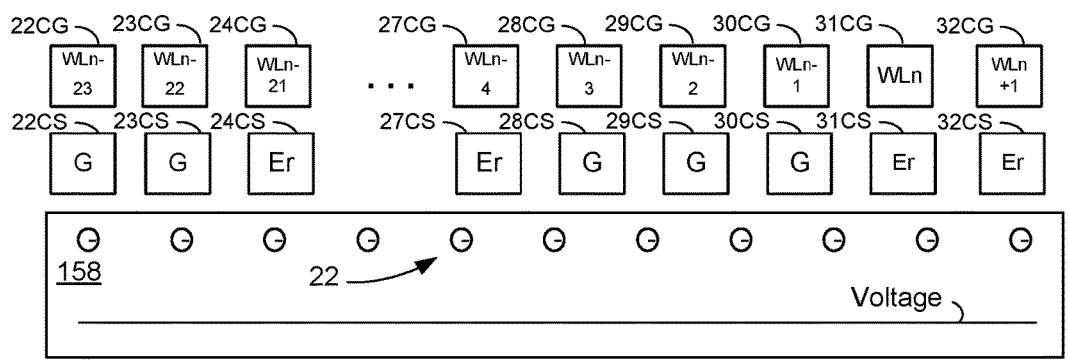
FIG. 9E depicts one example the final boosting voltages in the program inhibited NAND channel after the boosting voltages have been finalized on the word lines.

FIG. 9E depicts one example the final boosting voltages in the program inhibited NAND channel after the boosting voltages have been finalized on the word lines. The channel potential may be uniform throughout the NAND channel. Because the program inhibited NAND channel was cut off from both the bit line and the source line, the residual electrons may still be trapped in the NAND channel. The residual electrons may be spread throughout the NAND channel. However, these are not "hot" electrons. Hence, hot electron injection program disturb is eliminated, or at least reduced.

Step 906 includes applying a programming pulse to the selected word line while the unselected word lines are at the final boosting voltages.

The word lines in the first set and the word lines in the second set are selected to boost the channel potential in a manner to eliminate or at least reduce a lateral electric field in the program inhibited NAND string near the selected word line, in one embodiment. In one embodiment, the word lines in the first set and the word lines in the second set are selected to boost the channel potential in a manner to eliminate or at least reduce a lateral electric field that developed during the pre-charge phase in the program inhibited NAND string near the selected word line, in one embodiment.

The word lines in the first set and the word lines in the second set are selected to boost the channel potential in a manner to eliminate or at least reduce a potential gradient in the program inhibited NAND string near the selected word line, in one embodiment. The word lines in the first set and the word lines in the second set are selected to boost the channel potential in a manner to eliminate or at least reduce a potential gradient that developed during the pre-charge phase in the program inhibited NAND string near the selected word line, in one embodiment.

Figure 10:
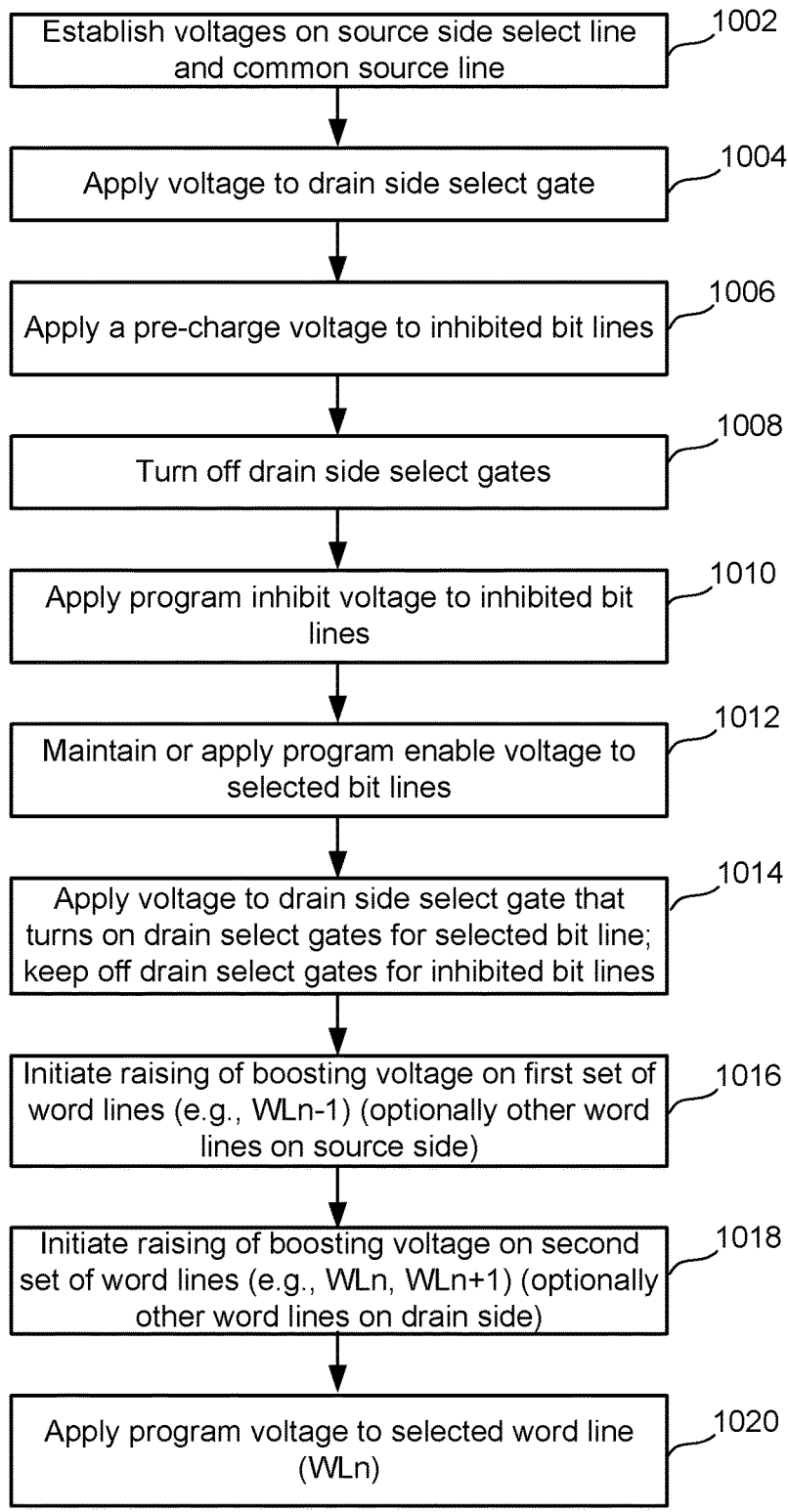
FIG. 10 provides further details for one embodiment of the process of FIG. 9A.
Figure 11:
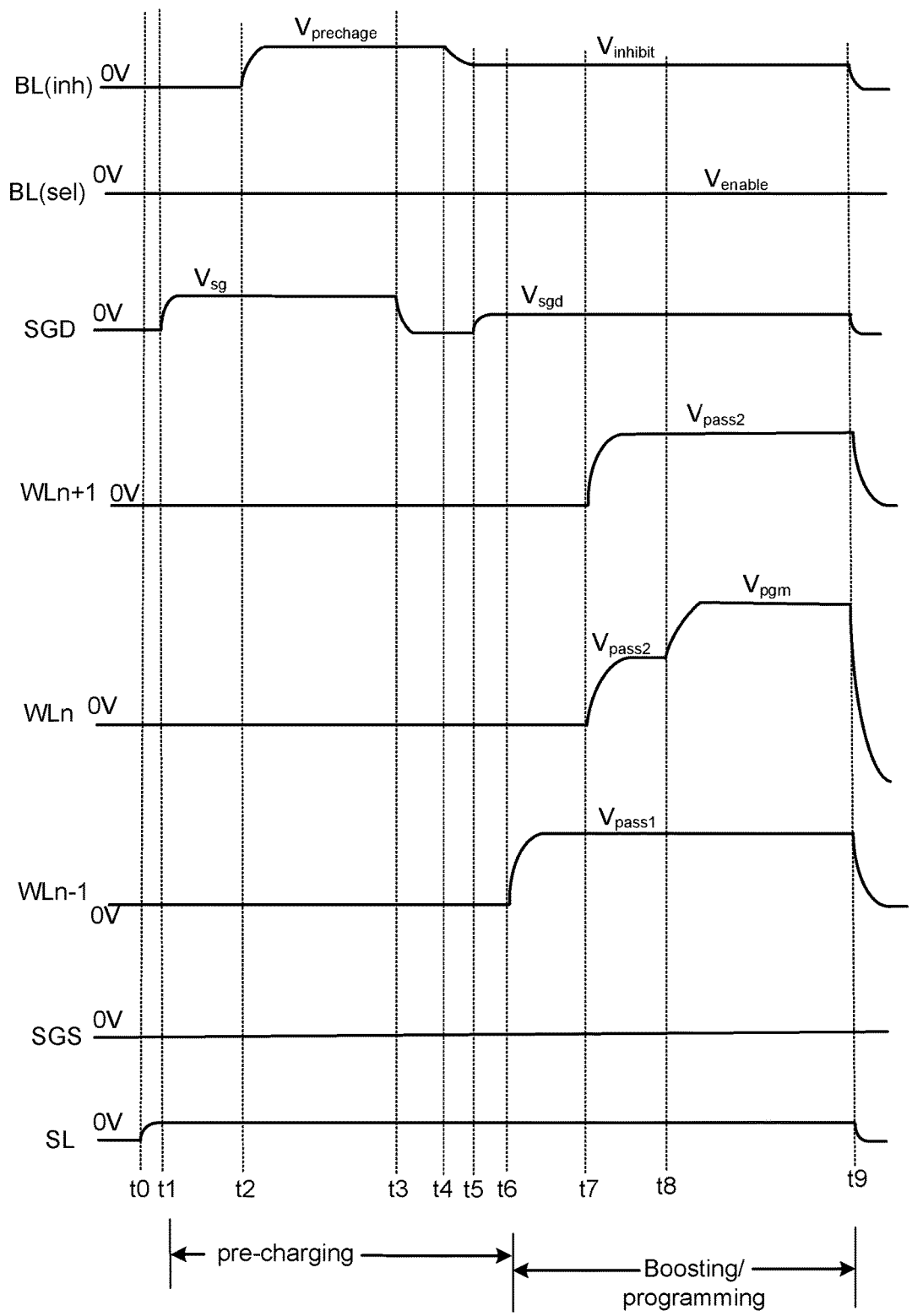
FIG. 11 depicts timing of signals applied during one embodiment of the process of FIG. 10.

FIG. 10 provides further details for one embodiment of the process of FIG. 9A. The process of FIG. 10 may be performed by a control circuit, which may include various elements shown in FIG. 2B. The process of FIG. 10 describes further details for one embiment in which the boosting voltage on the first set of word lines is raised prior to the boosting voltage on the second set of word lines, as in FIG. 9B. FIG. 11 depicts timing of signals applied during one embodiment of the process of FIG. 10.

In step 1002, voltages are established on the source side select line and the common source line. In one embodiment, a low voltage (e.g., about 1.0V-1.5V) is applied to the common source line. The low voltage may remain for the duration of the programming process. For example, at t0, FIG. 11 shows the low voltage applied to SL. The source line SL is kept at 0V in some embodiments. Note that the source side select gate line SGS may remain at 0V throughout the programming process, as depicted in FIG. 11. This keeps the source side select gates off throughout the process, in one embodiment. Thus, the source select gates are placed into isolation mode, in one embodiment.

A voltage is applied to the drain select gates at step 1004. This voltage may be sufficient to place the drain side select gates (of both program inhibited NAND strings and program enabled NAND strings) into a conductive state. FIG. 11 shows $V_{SG}$ applied to SGD at t1. $V_{SG}$ is a positive bias in one embodiment. $V_{SG}$ is on the order of about 3.5V to 4.5V, in one embodiment.

Optionally, a pre-charge enable voltage may be applied to word lines associated with the NAND strings. In one embodiment, the pre-charge enable voltage is 0V. FIG. 11 shows 0V applied to WLn−1, WLn, and WLn+1 at time t2. A non-zero voltage could be applied to one or more of the word lines at this time. The magnitude of the pre-charge enable voltage can be word line dependent. For example, the selected word line might have a greater pre-charge enable voltage than non-selected word lines. In one embodiment, the pre-charge enable voltage is large enough to place memory cells in the erased state into a conductive state. In one embodiment, all of the memory cells between the bit line and the selected word line are in the erased state, due to programming occurring from the word line nearest the source line to the word line nearest the bit line. Hence, the pre-charge enable voltage places all of the memory cells between the selected word line and the bit line into a conductive state, in one embodiment. The memory cell at the selected word line may also be placed into a conductive state, depending on its present threshold voltage. Memory cells on the source side of the selected word line might or might not be made conductive by the pre-charge enable voltage.

At step 1006, a pre-charge voltage is applied to the program inhibited bit lines. For example, FIG. 11 shows $V_{precharge}$ applied to the unselected bits lines at t2. Because the drain side select gates of the program inhibited NAND strings are turned on at this time, the bit line voltage will be passed to the channels of the program inhibited NAND strings. This results in charging the potential of at least a portion of the NAND string channel to approximately $V_{precharge}$. However, the entire program inhibited NAND string does not necessarily get charged to $V_{precharge}$. It is possible for some of the memory cells to be in a non-conductive state, as discussed above. Thus, in one embodiment, the pre-charge voltage passes as far into the program inhibited NAND channel as it is conductive. After that point, there may be a significant voltage gradient. In some cases, this voltage gradient may occur near the memory cell at the selected word line. Referring to FIG. 1D, as one example, the pre-charge voltage might be passed as far as WLn. However, because the memory cell at WLn−1 is in the G-state it is non-conductive. Thus, the pre-charge voltage may be cut off from being passed any further towards the common source line. As previously discussed, the threshold voltages of the memory cells between WLn and the source line, the voltage currently applied to the control gates of those memory cells, as well as the coupling ratio between their control gates and the NAND channel may establish the floating voltage in the portion of the NAND channel adjacent to those memory cells during the pre-charge phase.

At step 1008, the drain side select line voltage is lowered. FIG. 11 shows the SGD decreased from $V_{SG}$ to 0V at t3. Lowering the drain side select line voltage turns off the drain side select gates of both the program enabled NAND strings and the program inhibited NAND strings. This disconnects both selected and unselected NAND strings from their respective bit lines. This allows the pre-charge voltage in the channels of the unselected NAND strings to be maintained.

Step 1010 is to apply a program inhibit voltage to the program inhibited bit lines. FIG. 11 shows the voltage on unselected bit lines being reduced from the pre-charge voltage $V_{precharge}$ to $V_{INHIBIT}$ between times t4 and t5. In another embodiment, $V_{precharge}$ and $V_{INHIBIT}$ have the same magnitude. In another embodiment, $V_{precharge}$ has a lower magnitude than $V_{INHIBIT}$.

Step 1012 is to apply (or at least maintain) a program enable voltage on selected bit lines. In one embodiment, the program enable voltage is 0V. It may be the case that the selected bit lines are already at 0V. FIG. 11 shows the voltage on selected bit lines being at $V_{ENABLE}$ at t5. In one embodiment, values are stored in a latch associated with each NAND string to indicate whether the NAND string should be programmed or inhibited.

At step 1014, the voltage on the drain side select line is increased to a voltage that allows the unselected bit lines to remain disconnected from their bit NAND strings, but for which the selected bit lines are connected to their NAND strings. In other words, the drain side select gates for unselected NAND strings are off, whereas the drain side select gates for selected NAND strings are on. Note that the channel region of those NAND strings that are to be inhibited from programming are cutoff from their bit line, enabling boosting of those channel regions as hereinafter described. FIG. 11 shows the voltage on SGD increasing to $V_{SGD}$ at t5.

Note that the voltages on the bit lines may also impact whether the drain side select gates are on/off. In one embodiment, the voltages $V_{INHIBIT}$ and $V_{SGD}$ are suitable values to keep the drain side select gates of unselected NAND strings off. On the other hand, the voltages $V_{ENABLE}$ and $V_{SGD}$ are suitable values to keep the drain side select gates of selected NAND strings on.

At step 1016, a boosting voltage (e.g., $V_{PASS1}$) is initiated to a first set of word lines. In one embodiment, the first set includes at least WLn−1. The first set could include one or more additional word lines that are contiguous to the selected word line on the source side of the selected word line. FIG. 11 show the voltage on the WLn−1 beginning to increase towards $V_{PASS1}$ at t6. Prior to time t6, the voltage on WLn−1 was at the pre-charge voltage. Other word lines in the first set may have a similar waveform as WLn−1, at least as far as the timing. However, note that the magnitude for $V_{PASS1}$ does not need to be the same for each of the unselected word lines on the source side of WLn.

The boosting voltage causes the channel potential adjacent to the word lines in the first set to increase. In one embodiment, capacitive coupling between the respective control gates and channel lifts the channel potential. Thus, the pass voltage that is applied to the control gate may serve to boost a portion of the channel potential adjacent to the control gate.

At step 1018, a boosting voltage (e.g., $V_{PASS2}$) is initiated to a second set of word lines. In one embodiment, the second set includes at least WLn and WLn+1. The second set could include one or more additional word lines that are contiguous to the selected word line on the drain side of the selected word line. FIG. 11 shows the voltage on WLn and WLn+1 beginning to increase towards $V_{PASS2}$ at t7. Other word lines in the second set may have a similar waveform as WLn+1, at least as far as the timing. Note that the magnitude for $V_{PASS2}$ does not need to be the same for each of the unselected word lines on the drain side of WLn.

The boosting voltage causes the channel potential adjacent to the word lines in the second set to increase. However, by delaying the boosting of the word lines in the second set the boosting of the channel adjacent to the second set of word lines is delayed relative to the boosting of the channel adjacent to the first set of word lines. This may eliminate or at least reduce a potential gradient in the NAND channel. For example, this may eliminate or at least reduce a potential gradient near the borderline between the first and second sets of word lines. For example, prior to boosting at time t6, the channel potential adjacent to the second set of word lines may be greater than the channel potential adjacent to the first set of word lines (see, for example, FIG. 1B). Boosting the first set or word lines at time t6 can raise the channel potential adjacent to the first set. For example, the channel potential adjacent to WLn−1 can be increased starting at time t6. Also, other word lines contiguous with the selected word line such as, but not limited to WLn−2 and WLn−3 can also be in the first set of word lines. Hence, the channel potential adjacent to WLn−2 and WLn−3 can be increased started at time t6. Since, the boosting voltage has not yet been started on WLn and WLn+1 the potential gradient 97 can be reduced in magnitude between time t6 and t7. Thus, the lateral electric field due to the potential gradient 97 can also be reduced between time t6 and t7. FIG. 1D depicts one example of such reduction of potential gradient 97 (relative to FIG. 1B).

At some point between time t7 and t8, the boosting voltages are finalized. Therefore, the boosting voltage in the NAND channel may be finalized. FIG. 9E depicts one example in which the channel potential when the boosting voltages are finalized. Note that it is possible for there to be some leakage of the channel potential. Hence, it is possible for the channel potential to drop somewhat over time.

The program voltage $V_{PGM}$ is then applied to the selected word line at step 1020. FIG. 10(D) show the selected word line being increased from $V_{PASS2}$ to $V_{PGM}$ are t8. Thus, programming of memory cells connected to the selected word and for which the NAND string is enabled for programming have their threshold voltages raised by $V_{PGM}$, in one embodiment. When the program voltage is applied, the boosting voltages may be maintained on the unselected word lines. Thus, the boosted channel prevents programming of the memory cells connected to the selected word line and for which the NAND string is inhibited from programming.

Afterwards, the word lines, bit lines, source line, and drain select gate line are lowered to 0V, marking the completion of one programming iteration. This is illustrated after t9 of FIG. 10, in which the various voltages are lowered.

Figure 12:
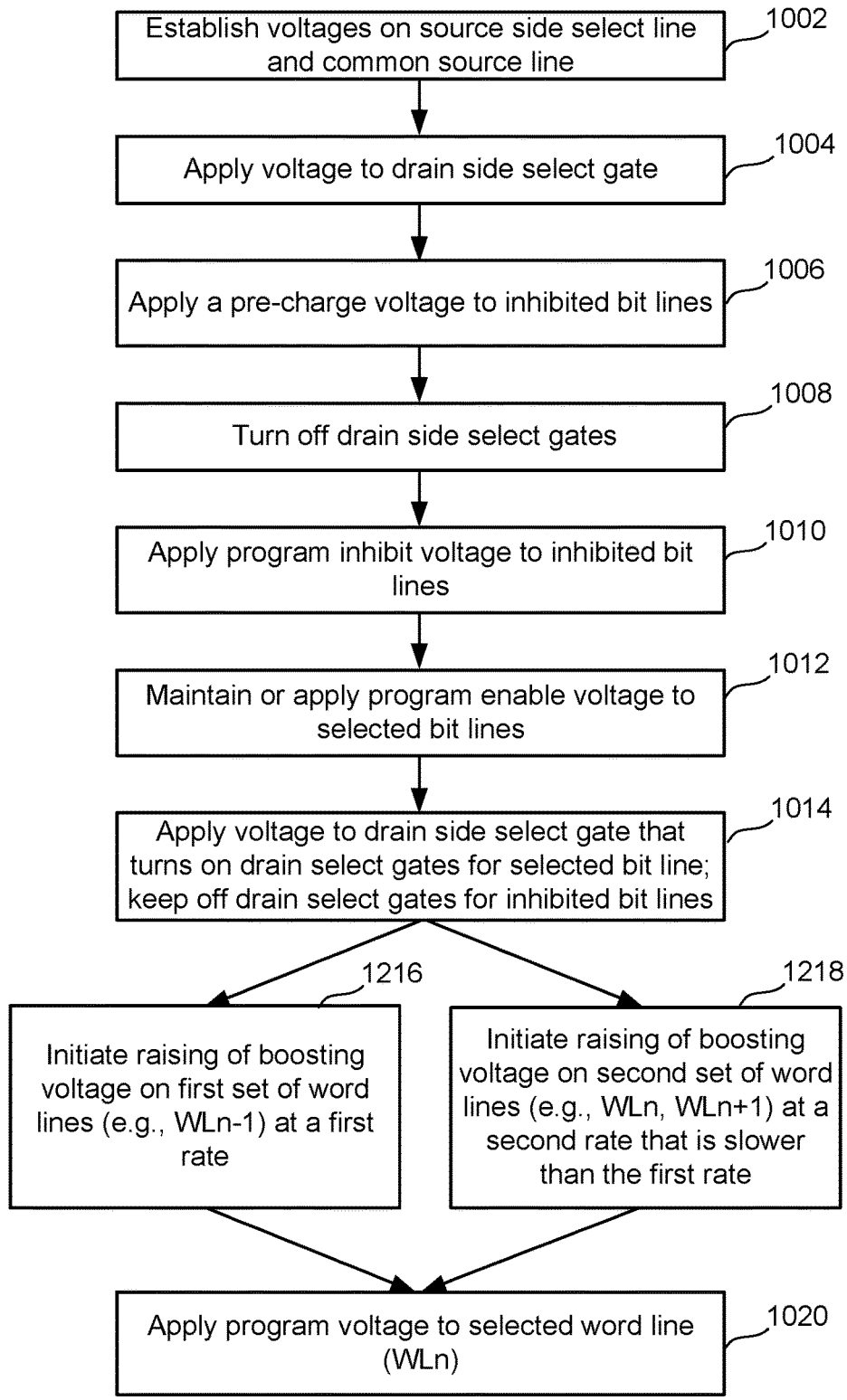
FIG. 12 provides further details for one embodiment of the process of FIG. 9A.
Figure 13:
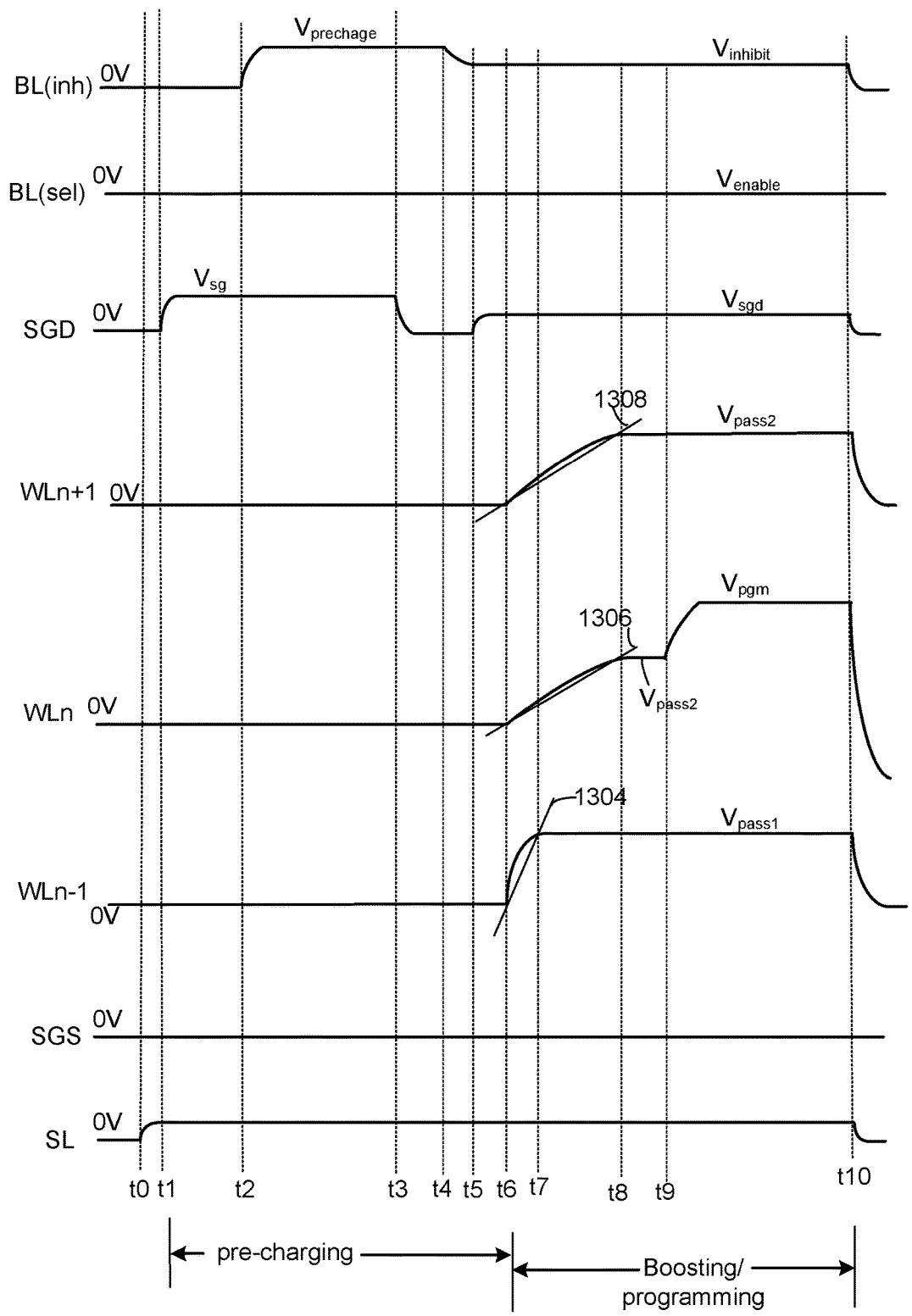
FIG. 13 depicts timing of signals applied during one embodiment of the process of FIG. 12.

FIG. 12 provides further details for one embodiment of the process of FIG. 9A. The process of FIG. 12 may be performed by a control circuit, which may include various elements shown in FIG. 2B. The process of FIG. 12 describes further details for one embodiment in which the boosting voltage on the first set of word lines is raised at a faster rate than the boosting voltage on the second set of word lines, as in FIG. 9C or 9D. FIG. 13 depicts timing of signals applied during one embodiment of the process of FIG. 12. Because there are many similarities with the process of FIG. 10 and timing of signals in FIG. 11, FIG. 12 and FIG. 13 will not be described in detail. Steps 1012-1014 of the process of FIG. 12 may be similar to steps 1012-1014 of FIG. 10. The timing of signals may also be similar for those steps.

Step 1216 includes initiating raising of a boosting voltage on a first set of word lines at a first rate. Step 1218 includes initiating raising of a boosting voltage on a second set of word lines at a second rate that is slower than the first rate. FIG. 13 depicts boosting voltages starting to rise at time t6.

Thus, the initiating the raising of the boosting voltages on the first and second sets of word lines may start at the same time.

For the boosting voltage waveform on WLn−1, the rate of increase is defined in FIG. 13 as the slope between the time the voltage waveform begins (t6) and time t7. For the boosting voltage waveform on WLn and WLn+1, the rate of increase is defined in FIG. 13 as the slope between the time the voltage waveform begins (t6) and time t8. The rate of increase for the boosting voltage on WLn−1 is faster than the rate of increase of the boosting voltage on WLn. This is because the slope of line 1304 is greater than the slope of line 1306. Also, the rate of increase for the boosting voltage on WLn−1 is faster than the rate of increase of the boosting voltage on WLn+1. This is because the slope of line 1304 is greater than the slope of line 1308. By the time that the voltage on the WLn−1 has increased by a sufficient amount to make the memory cell connected to WLn−1 at least weakly conductive, the voltage on WLn−1 has increased by more than the voltage on WLn, in one embodiment. Time t7 is selected as an example of the time at which the memory cell connected to WLn−1 at least weakly conductive. Likewise, by the time that the voltage on the WLn−1 has increased by a sufficient amount to make the memory cell connected to WLn−1 at least weakly conductive, the voltage on WLn−1 has increased by more than the voltage on WLn+1. Thus, initially the voltage increases at a faster rate on WLn−1 than WLn or WLn+1.

At step 1020, the program voltage is applied to the selected word line. FIG. 13 depicts Vpgm applied to WLn starting at time t9. By this time, the boosting voltages have stabilized on the unselected word lines. At time t0, various voltages may be reduced to steady state values.

In another embodiment, techniques of delaying the boosting voltage on the second set of word lines is combined with a lower ramp rate of the boosting voltage on the second set of word lines. Significantly, with such a technique by the time that memory cells in the first set of word lines are at least weakly conductive, a potential gradient in the NAND channel may be reduced or eliminated.

In one embodiment, a three-dimensional (3D) non-volatile storage device comprises a plurality of bit lines, a common source line, a plurality of word lines, a plurality of NAND strings of memory cells, and a control circuit in communication with the plurality of bit lines, the common source line, and the plurality of word lines. Each of the NAND strings has a channel. Each of the NAND strings has a source end coupled to the common source line and a drain end coupled to a bit line of the plurality of bit lines. Each of the memory cells is associated with a word line of the plurality of word lines. The control circuit is configured to pre-charge a channel of a program inhibited NAND string during a pre-charge phase of a programming operation. The program inhibited NAND string has memory cells connected to a first set of word lines and a second set of word lines. The first set of word lines include a first unselected word line that neighbors a selected word line towards the source end. The second set of word lines include the selected word line and a second unselected word line that neighbors the selected word line towards the drain end. The control circuit is configured to, during a boosting phase of the programming operation, initially increase a voltage on the first set of word lines by a greater amount than the control circuit initially increases a voltage on the second set of word lines. The control circuit is configured to finalize boosting voltages on the first set and the second set of word lines to respective final boosting voltages during the boosting phase of the programming operation. The control circuit is configured to finalize apply a programming voltage to the selected word line during a programming phase of the programming operation.

One embodiment includes a method of operating 3D NAND. The method comprises establishing one or more pre-charge voltages in a channel of a program inhibited 3D NAND string during a programming operation of a selected 3D NAND string. The program inhibited 3D NAND string has a source end coupled to a common source line and a drain end coupled to a bit line. The program inhibited 3D NAND string and the selected 3D NAND string are associated with a plurality of word lines that comprise a selected word line, a first unselected word line that neighbors the selected word line on a source side of the program inhibited 3D NAND string, and a second unselected word line that neighbors the selected word line on a drain side of the program inhibited 3D NAND string. Establishing the one or more pre-charge voltages comprises applying a pre-charge voltage to the selected word line, the first unselected word line, and the second unselected word line. The method also comprises boosting a channel potential of the program inhibited 3D NAND string during a channel boosting phase of the programming operation. Boosting the channel potential comprises initially raising the voltage on the first unselected word line from the pre-charge voltage by a first voltage while initially raising the voltage on the selected word line and the second unselected word line from the pre-charge voltage by a second voltage that is less than the first voltage, and continuing to raise the voltages on the first and the second unselected word lines to respective final boosting voltages. The method also comprises applying a programming voltage to the selected word line after the first and the second unselected word lines are at their respective final boosting voltages.

One embodiment includes a three-dimensional (3D) non-volatile storage apparatus, comprising a plurality of bit lines, a common source line, a plurality of conductive layers alternating with a plurality of insulating layers in a stack, a plurality of NAND strings of memory cells, and a control circuit in communication with the plurality of bit lines, the common source line, and the word lines associate with the memory cells. Each NAND string extends through the stack. Each of the NAND strings has a channel. Each of the NAND strings has a drain end coupled to a bit line of the plurality of bit lines and a source end coupled to the common source line. Each of the memory cells is associated with a word line formed from at least a portion of one of the conductive layers. The control circuit establishes one or more pre-charge voltages in the channel of a program inhibited NAND string during a programming operation of a selected NAND string that shares word lines with the program inhibited NAND string. The program inhibited NAND string has a first memory cell connected to a selected word line, a second memory cell that neighbors the first memory on the source end of the program inhibited NAND string, and a third memory cell that neighbors the first memory on the drain end of the program inhibited NAND string. The control circuit initially boosts a channel potential adjacent the second memory cell during a boosting phase of the programming operation by a first voltage and initially boosts a channel potential adjacent the first memory cell and the third memory cell by a second voltage that is less than the first voltage during the boosting phase. The control circuit finalizes boosting of the channel potential of the program inhibited NAND string during the boosting phase. The control circuit applies a programming voltage to the selected word line associated with the first memory cell during a programming phase of the programming operation.

One embodiment includes a three-dimensional (3D) non-volatile storage apparatus, comprising: a plurality of bit lines; a common source line; a plurality of word lines; and a plurality of NAND strings of memory cells. Each of the NAND strings has a channel. Each of the NAND strings having a source end coupled to the common source line and a drain end coupled to a bit line. Each of the memory cells associated with a word line of the plurality of word lines. The apparatus further comprises means for applying a first voltage to a selected word line, a second voltage to a first unselected word line that neighbors the selected word line towards the source end, and a third voltage to a second unselected word line that neighbors the selected word line towards the drain end during a pre-charge phase of a programming operation. The selected word line and the first and second unselected word lines are associated with both a selected NAND string and a program inhibited NAND string. The apparatus further comprises means for initially increasing the second voltage on the first unselected word line by a fourth voltage and initially increase the first voltage on the selected word line and the third voltage on the second unselected word line by less than the fourth voltage during a boosting phase of the programming operation. The apparatus further comprises means for finalizing boosting voltages on the first and the second unselected word lines to respective final boosting voltages during the boosting phase of the programming operation. The apparatus further comprises means for applying a programming voltage to the selected word line while the respective final boosting voltages are on the first and the second unselected word lines during a programming phase of the programming operation.

In one embodiment, the means for applying a first voltage to a selected word line, a second voltage to a first unselected word line that neighbors the selected word line towards the source end, and a third voltage to a second unselected word line that neighbors the selected word line towards the drain end during a pre-charge phase of a programming operation could include, but is not limited to, controller 122, control circuitry 110, state machine 112, power control 116, read/write circuits 128, processor 122c, row decoder 124, and/or column decoder 132.

In one embodiment, the means for initially increasing the second voltage on the first unselected word line by a fourth voltage and initially increase the first voltage on the selected word line and the third voltage on the second unselected word line by less than the fourth voltage during a boosting phase of the programming operation could include, but is not limited to, controller 122, control circuitry 110, state machine 112, power control 116, read/write circuits 128, processor 122c, a voltage regulator, a configurable RC network, and/or tunable resistor.

In one embodiment, the means for finalizing boosting voltages on the first and the second unselected word lines to respective final boosting voltages during the boosting phase of the programming operation could include, but is not limited to, controller 122, control circuitry 110, state machine 112, power control 116, read/write circuits 128, processor 122c, a voltage regulator, a configurable RC network, and/or tunable resistor.

In one embodiment, the means for applying a programming voltage to the selected word line while the respective final boosting voltages are on the first and the second unselected word lines during a programming phase of the programming operation could include, but is not limited to, controller 122, control circuitry 110, state machine 112, power control 116, and/or read/write circuits 128, processor 122c.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A three-dimensional (3D) non-volatile storage apparatus, comprising:
    a plurality of bit lines;
    a common source line;
    a plurality of word lines;
    a plurality of NAND strings of memory cells, each of the NAND strings having a channel, each of the NAND strings having a source end coupled to the common source line and a drain end coupled to a bit line of the plurality of bit lines, each of the memory cells associated with a word line of the plurality of word lines;
    a control circuit in communication with the plurality of bit lines, the common source line, and the plurality of word lines, the control circuit configured to:
    pre-charge a channel of a program inhibited NAND string during a pre-charge phase of a programming operation, the program inhibited NAND string having memory cells connected to a first set of word lines and a second set of word lines, the first set of word lines including a first unselected word line that neighbors a selected word line towards the source end, the second set of word lines including the selected word line and a second unselected word line that neighbors the selected word line towards the drain end;
    during a boosting phase of the programming operation, initially increase a voltage on the first set of word lines by a greater amount than the control circuit initially increases a voltage on the second set of word lines;
    finalize boosting voltages on the first set and the second set of word lines to respective final boosting voltages during the boosting phase of the programming operation; and
    apply a programming voltage to the selected word line during a programming phase of the programming operation.

2. The 3D non-volatile storage apparatus of claim 1, wherein the control circuit being configured to initially increase a voltage on the first set of word lines by a greater amount than the control circuit initially increases a voltage on the second set of word lines comprises the control circuit being configured to:
    begin to apply a boosting voltage to the first set of word lines prior to when the control circuit is configured to begin to apply a boosting voltage to the second set of word lines.

3. The 3D non-volatile storage apparatus of claim 1, wherein the control circuit being configured to initially increase a voltage on the first set of word lines by a greater amount than the control circuit initially increases a voltage on the second set of word lines comprises the control circuit being configured to:

ramp a boosting voltage on the first set of word lines at a faster rate than the control circuit is configured to ramp a boosting voltage on the second set of word lines.

4. The 3D non-volatile storage apparatus of claim 1, wherein the control circuit being configured to pre-charge a channel of a program inhibited NAND string during a programming operation comprises the control circuit configured to:
establish a first pre-charge voltage in the channel of the program inhibited NAND string adjacent a memory cell connected to the selected word line; and
establish a second pre-charge voltage in the channel of the program inhibited NAND string adjacent a memory cell connected to the first unselected word line, wherein the second pre-charge voltage is less than the first pre-charge voltage.

5. The 3D non-volatile storage apparatus of claim 1, wherein the first set includes all unselected word lines between the selected word line and the source end of the program inhibited NAND string.

6. The 3D non-volatile storage apparatus of claim 5, wherein the second set includes all unselected word lines between the selected word line and the drain end of the program inhibited NAND string.

7. The 3D non-volatile storage apparatus of claim 1, wherein the control circuit being configured to initially increase a voltage on the first set of word lines by a greater amount than the control circuit initially increases a voltage on the second set of word lines comprises the control circuit being configured to:
increase the voltage on the first unselected word line by more than the voltage increase on either the selected word line or the second selected word line by the time that a memory cell connected to the first selected word line becomes conductive.

8. A method of operating a three dimensional (3D) NAND memory device, the method comprising:
establishing one or more pre-charge voltages in a channel of a program inhibited 3D NAND string during a programming operation of a selected 3D NAND string, the program inhibited 3D NAND string having a source end coupled to a common source line and a drain end coupled to a bit line, the program inhibited 3D NAND string and the selected 3D NAND string are associated with a plurality of word lines that comprise a selected word line, a first unselected word line that neighbors the selected word line on a source side of the program inhibited 3D NAND string, and a second unselected word line that neighbors the selected word line on a drain side of the program inhibited 3D NAND string, establishing the one or more pre-charge voltages comprises applying a pre-charge voltage to the selected word line, the first unselected word line, and the second unselected word line;
boosting a channel potential of the program inhibited 3D NAND string during a channel boosting phase of the programming operation, boosting the channel potential comprising:
initially raising the voltage on the first unselected word line from the pre-charge voltage by a first voltage while initially raising the voltage on the selected word line and the second unselected word line from the pre-charge voltage by a second voltage that is less than the first voltage; and
continuing to raise the voltages on the first and the second unselected word lines to respective final boosting voltages; and
applying a programming voltage to the selected word line after the first and the second unselected word lines are at their respective final boosting voltages.

9. The method of claim 8, wherein initially raising the voltage on the first unselected word line from the pre-charge voltage by the first voltage while initially raising the voltage on the selected word line and the second unselected word line from the pre-charge voltage by the second voltage that is less than the first voltage comprises:
initiating application of a first boosting voltage to the first unselected word line prior to initiating application of a second boosting voltage to the selected word line and prior to initiating application of a third boosting voltage to the second unselected word line.

10. The method of claim 8, wherein initially raising the voltage on the first unselected word line from the pre-charge voltage by the first voltage while initially raising the voltage on the selected word line and the second unselected word line from the pre-charge voltage by the second voltage that is less than the first voltage comprises:
ramping a first boosting voltage to the first unselected word line at a faster rate than ramping a second boosting voltage to the selected word line and at a faster rate than ramping a third boosting voltage to the second unselected word line, including beginning to ramp the first boosting voltage, the second boosting voltage, and the third boosting voltage at approximately the same time.

11. The method of claim 8, wherein establishing the one or more pre-charge voltages in the channel of the program inhibited 3D NAND string during the programming operation of the selected 3D NAND string comprises:
establishing a voltage gradient in a portion of the channel of the program inhibited NAND string adjacent a memory cell connected to the selected word line and a memory cell connected to the first unselected word line.

12. The method of claim 8, wherein boosting the channel potential comprises:
initially raising the voltage on all unselected word lines between the selected word line and the source end of the program inhibited 3D NAND string by a greater amount than initially raising the voltage on either the selected word line or the second unselected word line.

13. The method of claim 12, wherein boosting the channel potential further comprises:
initially raising the voltage on all unselected word lines between the selected word line and the drain end of the program inhibited 3D NAND string by a lesser amount than initially raising the voltage on the first unselected word line.

14. The method of claim 8, wherein initially raising the voltage on the first unselected word line from the pre-charge voltage by the first voltage while initially raising the voltage on the selected word line and the second unselected word line from the pre-charge voltage by the second voltage that is less than the first voltage comprises:
raising the voltage on the first unselected word line by more than the voltage is raised on either the selected word line or the second selected word line by the time that a memory cell connected to the first selected word line becomes conductive.

15. A three-dimensional (3D) non-volatile storage apparatus, comprising:
a plurality of bit lines;
a common source line;

a plurality of conductive layers alternating with a plurality of insulating layers in a stack;

a plurality of NAND strings of memory cells, each NAND string extending through the stack, each of the NAND strings having a channel, each of the NAND strings having a drain end coupled to a bit line of the plurality of bit lines and a source end coupled to the common source line, each of the memory cells associated with a word line formed from at least a portion of one of the conductive layers;

a control circuit in communication with the plurality of bit lines, the common source line, and the word lines associate with the memory cells, the control circuit:

establishes one or more pre-charge voltages in the channel of a program inhibited NAND string during a programming operation of a selected NAND string that shares word lines with the program inhibited NAND string, the program inhibited NAND string having a first memory cell connected to a selected word line, a second memory cell that neighbors the first memory on the source end of the program inhibited NAND string, and a third memory cell that neighbors the first memory on the drain end of the program inhibited NAND string;

initially boosts a channel potential adjacent the second memory cell during a boosting phase of the programming operation by a first voltage and initially boosts a channel potential adjacent the first memory cell and the third memory cell by a second voltage that is less than the first voltage during the boosting phase;

finalizes boosting of the channel potential of the program inhibited NAND string during the boosting phase; and applies a programming voltage to the selected word line connected to the first memory cell during a programming phase of the programming operation.

16. The 3D non-volatile storage apparatus of claim 15, wherein the second memory cell is non-conductive when the control circuit establishes the one or more pre-charge voltages, the control circuit initially boosts the channel potential adjacent the second memory cell during the boosting phase by the first voltage prior to a time at which the second memory cell becomes conductive during the boosting phase.

17. The 3D non-volatile storage apparatus of claim 15, wherein to initially boost the channel potential adjacent the second memory cell during the boosting phase of the programming operation by the first voltage and initially boost the channel potential adjacent the first memory cell and the third memory cell during the boosting phase by the second voltage the control circuit:

boosts the voltage in the channel adjacent to the second memory cell prior to boosting the voltage in the channel adjacent the first memory cell and prior to boosting the voltage in the channel adjacent the third memory cell.

18. The 3D non-volatile storage apparatus of claim 15, wherein to initially boost the channel potential adjacent the second memory cell during the boosting phase of the programming operation by the first voltage and initially boost the channel potential adjacent the first memory cell and the third memory cell during the boosting phase by the second voltage the control circuit:

boosts the voltage in the channel adjacent to the second memory cell at a faster rate than the control circuit boosts the voltage in the channel adjacent the first memory cell and at a faster rate than the control circuit boosts the voltage in the channel adjacent the third memory cell.

19. The 3D non-volatile storage apparatus of claim 15, wherein the one or more pre-charge voltages in the channel of the program inhibited NAND string comprise:

a first pre-charge voltage in the channel adjacent the second memory cell; and a second pre-charge voltage in the channel adjacent the first memory cell, wherein the second pre-charge voltage is greater than the first pre-charge voltage.

20. A three-dimensional (3D) non-volatile storage apparatus, comprising:

a plurality of bit lines;

a common source line;

a plurality of word lines;

a plurality of NAND strings of memory cells, each of the NAND strings having a channel, each of the NAND strings having a source end coupled to the common source line and a drain end coupled to a bit line, each of the memory cells associated with a word line of the plurality of word lines;

means for applying a first voltage to a selected word line, a second voltage to a first unselected word line that neighbors the selected word line towards the source end, and a third voltage to a second unselected word line that neighbors the selected word line towards the drain end during a pre-charge phase of a programming operation, the selected word line and the first and second unselected word lines associated with both a selected NAND string and a program inhibited NAND string;

means for initially increasing the second voltage on the first unselected word line by a fourth voltage and initially increase the first voltage on the selected word line and the third voltage on the second unselected word line by less than the fourth voltage during a boosting phase of the programming operation;

means for finalizing boosting voltages on the first and the second unselected word lines to respective final boosting voltages during the boosting phase of the programming operation; and means for applying a programming voltage to the selected word line while the respective final boosting voltages are on the first and the second unselected word lines during a programming phase of the programming operation.

* * * * *